United States Patent
Sato et al.

(10) Patent No.: US 7,619,251 B2
(45) Date of Patent: Nov. 17, 2009

(54) LASER CRYSTALLIZATION METHOD SUPPRESSING PROPAGATION OF CRACKS FORMING A DISPLAY DEVICE

(75) Inventors: Takeshi Sato, Kokubunji (JP); Takahiro Kamo, Tokyo (JP); Takeshi Noda, Mobara (JP)

(73) Assignee: Hitachi Displays, Ltd., Chiba-ken (JP)

( * ) Notice: Subject to any disclaimer, the term of this patent is extended or adjusted under 35 U.S.C. 154(b) by 41 days.

(21) Appl. No.: 11/440,180

(22) Filed: May 25, 2006

(65) Prior Publication Data

US 2006/0270130 A1    Nov. 30, 2006

(30) Foreign Application Priority Data

May 26, 2005    (JP)    ............................. 2005-153426

(51) Int. Cl.
- *H01L 29/04* (2006.01)
- *H01L 31/036* (2006.01)
- *H01L 21/84* (2006.01)
- *H01L 21/36* (2006.01)

(52) U.S. Cl. .......................... 257/67; 257/64; 438/149; 438/150; 438/486

(58) Field of Classification Search ................ 257/223, 257/227, 291, 292, 439, 443, 655, E27.1, 257/E27.125, E27.112, E29.117, E29.145, 257/E29.147, E29.151, E29.182, E29.202, 257/E29.273–E29.299, E29.314, E29.32, 257/E23.016, E21.094, E21.104, E21.121, 257/E21.372, E21.411–E21.416, 64, 67; 438/149–150, 486

See application file for complete search history.

(56) References Cited

U.S. PATENT DOCUMENTS

| 5,920,244 A | 7/1999 | Kobayashi et al. |
| 2002/0043660 A1* | 4/2002 | Yamazaki et al. ............. 257/59 |
| 2005/0121672 A1* | 6/2005 | Yamazaki et al. ............. 257/59 |
| 2005/0179851 A1* | 8/2005 | Hayashi et al. ............. 349/152 |

FOREIGN PATENT DOCUMENTS

JP    2003-086505    8/2001

(Continued)

OTHER PUBLICATIONS

Michael Quirk, Julian Serda, Semiconductor Device Manufacturing Technology, Prentice Hall, 2001, pp. 98-99.*

*Primary Examiner*—Steven Loke
*Assistant Examiner*—Arman Khosraviani
(74) *Attorney, Agent, or Firm*—Stites & Harbison PLLC; Juan Carlos A. Marquez, Esq.

(57) ABSTRACT

A method of irradiating at least a part of a semiconductor film on the substrate with a CW or pseudo-CW laser beam so as to grow crystals laterally. A region over the semiconductor film having Si as a chief component is provided with a pixel region, a gate line driving circuit region and a signal line driving circuit region for driving pixels, and a terminal region where connection terminals will be formed. The region not irradiated with the CW laser beam is provided in a peripheral portion of each semiconductor device corresponding to the position where the glass substrate will be cut. Due to this means, it is possible to suppress occurrence of a failure caused by propagation of cracks when the substrate is cut.

3 Claims, 18 Drawing Sheets

| FOREIGN PATENT DOCUMENTS | | |
|---|---|---|
| JP | 2004-056058 | 7/2002 |
| JP | 2005-099427 | 9/2003 |
| JP | 2005-347764 | 7/2005 |
| JP | 2007-092142 | 9/2005 |
| JP | 2008-141179 | 10/2007 |

* cited by examiner

ON LINE B-B'

ON LINE C-C'

ON LINE D-D'

ON LINE B-B'

ON LINE C-C'

ON LINE D-D'

ON LINE B-B'

ON LINE C-C'

ON LINE D-D'

ON LINE B-B'

ON LINE C-C'

ON LINE D-D'

ON LINE B-B'

ON LINE C-C'

ON LINE D-D'

ON LINE B-B'

ON LINE C-C'

ON LINE D-D'

ON LINE B-B'

ON LINE C-C'

ON LINE D-D'

ON LINE B-B'

ON LINE C-C'

ON LINE D-D'

ON LINE B-B'

ON LINE C-C'

ON LINE D-D'

ON LINE B-B'

ON LINE C-C'

ON LINE D-D'

LASER CRYSTALLIZATION METHOD SUPPRESSING PROPAGATION OF CRACKS FORMING A DISPLAY DEVICE

FIELD OF THE INVENTION

The present invention relates to a semiconductor device for use in a liquid crystal display device, a display device using organic electroluminescence elements or a drive-circuit built-in type display device particularly using a low-temperature polycrystalline silicon technique, and a method for manufacturing the semiconductor device.

BACKGROUND OF THE INVENTION

Liquid crystal display devices have been used broadly as monitors for various information apparatus such as television receivers or personal computers due to their properties of low profile and low power consumption. In recent years, a drive circuit has been formed on a substrate out of thin-film transistors (hereinafter also referred to as "TFT") using a low-temperature polycrystalline silicon (Si) film so as to achieve high definition and low cost. According to the low-temperature polycrystalline Si technology, a comparatively low-priced glass substrate can be used as the substrate. When the size of the glass substrate is increased, the productivity can be improved. The process temperature of low-temperature polycrystalline Si is usually not higher than 600° C. The strain point indicating the heat resistance of the substrate is required to be higher than the process temperature. Therefore, a glass substrate having a strain point at about 700° C. is used. A quartz substrate having a higher strain point of about 1,000° C. can be used. However, the quartz substrate is expensive and difficult to be formed with a large area.

A laser crystallization method in which an amorphous Si film is formed and then annealed with a laser beam so as to be crystallized is generally used as a method for manufacturing a semiconductor thin film as typified by a polycrystalline Si film. Particularly, a so-called excimer laser annealing system using a pulsed excimer laser beam capable of obtaining high laser energy is often used.

In recent years, a method in which crystals are grown laterally (in the scanning direction of a laser) using a so-called CW (Continuous Wave) laser beam or a pseudo-CW laser beam with an extremely high pulse repetition frequency not lower than several tens of MHz has been researched as a method for forming a semiconductor thin film having higher mobility than that of a semiconductor thin film obtained by an excimer laser annealing process. However, there is a problem that the output of each of the CW laser beam and the pseudo-CW laser beam is lower than that of the pulsed excimer laser beam so that the throughput is low.

JP-A-2004-56058 discloses a SELAX (Selectively Enlarging Laser Crystallization) method in which only a peripheral circuit portion requiring especially high-performance TFTs is irradiated with a pseudo-CW laser beam so as to be selectively provided with high performance. JP-A-2003-086505 discloses a method in which an Si film formed like islands is irradiated with a CW laser beam so that high-performance TFTs are formed.

For example, a CW laser beam obtained by converting the wavelength of a solid-state laser beam of 1,064 nm into 532 nm is used as the CW laser beam. There is a method in which the beam is shaped like a so-called line which will be a rectangle longer in the vertical direction than in the scanning direction on a substrate in order to expand the area which can be processed at one time, and to improve the throughput.

In order to improve the throughput, it is advantageous that a plurality of regions of semiconductor devices serving as circuits are disposed in a straight line on a substrate and irradiated with a CW laser beam while the substrate is scanned therewith so that the plurality of regions of the semiconductor devices are crystallized in one scan. It was, however, proved that when a glass substrate (hereinafter also referred to as "substrate" simply) is cut, cracks about several μm deep begin at the cutting position and propagate to the laser-irradiated areas on the substrate surface. FIG. 19 is an explanatory view of the method for crystallization using a CW laser. FIG. 20 is a view showing the stress generated by irradiation with the CW laser beam and the cutting position of the substrate. FIG. 21 is a view for explaining the state where cracks propagate due to the cutting of the substrate.

In FIG. 19, a substrate GLS is irradiated with a CW laser beam CWB while being scanned therewith in a short beam width direction S of the CW laser beam CWB. The CW laser beam CWB has a linear shape whose short beam width SBW is extremely shorter than the longer beam width LBW. Due to this irradiation, crystals of a semiconductor film PSI formed on the substrate GLS and made of polycrystalline Si are grown laterally. Thus, a semiconductor film SLX is obtained. When the region of the semiconductor film SLX formed by the irradiation with the CW laser beam was cut along a cutting position CUT shown in FIG. 20, it was observed that minute cracks CLK began at the cutting position CUT and propagated across the laser-irradiated region on the substrate surface, as shown in FIG. 21. When such cracks CLK are generated, there occurs a failure such as disconnection in a device formed on the substrate GLS and made of a thin film.

SUMMARY OF THE INVENTION

An object of the present invention is to provide a semiconductor device having high reliability due to suppression of cracks which may be generated when a substrate having a semiconductor film crystallized with a CW laser beam is cut.

In order to attain the foregoing object, the present invention provides a method for manufacturing semiconductor devices (display panels such as liquid crystal panels or organic EL panels) using a glass substrate having a strain point not higher than 750° C. The method includes the step of irradiating at least a part of a semiconductor film on the substrate with a CW or pseudo-CW laser beam so as to grow crystals laterally. The semiconductor film contains Si as a chief component. The method is first characterized in that a region not irradiated with the CW laser beam is provided in a peripheral portion of each semiconductor device corresponding to the position where the glass substrate will be cut. Due to this means, it is possible to suppress occurrence of a failure caused by propagation of cracks when the substrate is cut.

There is a characteristic in the propagation direction of any crack. As shown in FIG. 21, there was observed a tendency that cracks propagated to diverge peripherally when they propagated in the substrate scanning direction, and propagated to converge centrally when they propagated in the opposite direction to the substrate scanning direction. This phenomenon is estimated to occur in the following manner. That is, the surface of the glass substrate is heated and cooled when it is irradiated with the CW laser beam. Due to this heating and cooling, residual stress RTN occurs in the substrate surface in a direction shown in FIG. 20. Any crack propagates to relax the residual stress RTN.

The present inventors made researches about the conditions that cracks propagate in a region irradiated with the CW laser beam. As a result, the present inventors discovered that there is a correlation between the propagation of cracks and the tensile stress generated in the substrate surface in the region irradiated with the CW laser beam, and the propagation of cracks in the irradiated region can be suppressed by controlling the stress or specifically by making the increment of tensile stress caused by the irradiation with the CW laser beam in the substrate surface not higher than 200 N/m. Accordingly, in order to attain the foregoing object, the present invention is secondly characterized in that the increment of tensile stress caused by the irradiation with the CW laser beam in the substrate surface is made not higher than 200 N/m.

The present inventors also made researches about the tensile stress of the substrate surface generated by the irradiation with the CW laser beam. As a result, the present inventors discovered that the tensile stress has little change when only the semiconductor film is etched, but the tensile stress leading to cracks can be substantially perfectly removed when the undercoat film and the surface of the glass substrate where the semiconductor film is formed is etched with a depth of about 1 μm. Accordingly, in order to attain the foregoing object, the present invention is thirdly characterized by including the step of etching the undercoat film on the glass substrate and the glass substrate in the peripheral portion of each semiconductor device corresponding to the substrate cutting position.

The present inventors also made researches about the conditions that cracks occur. As a result, the present inventors discovered that propagation of cracks can be suppressed when an insulating film such as a silicon oxide film is deposited to be about 0.5 μm thick on the substrate. In order to attain the foregoing object, the present invention is fourthly characterized in that an insulating film made of a silicon oxide film or a silicon nitride film not thinner than 0.5 μm is deposited on the undercoat film on the substrate in the periphery of each semiconductor device corresponding to the substrate cutting position.

According to the present invention, it is possible to suppress cracks which may be generated when the substrate is cut, and which may cause a problem when a semiconductor device using a semiconductor film crystallized by use of a CW laser beam is manufactured. It is therefore possible to obtain a semiconductor with a high performance circuit.

DETAILED DESCRIPTION OF THE INVENTION

Preferred embodiments according to the present invention will be described below in detail with reference to the drawings of the embodiments.

First Embodiment

Figure 1:
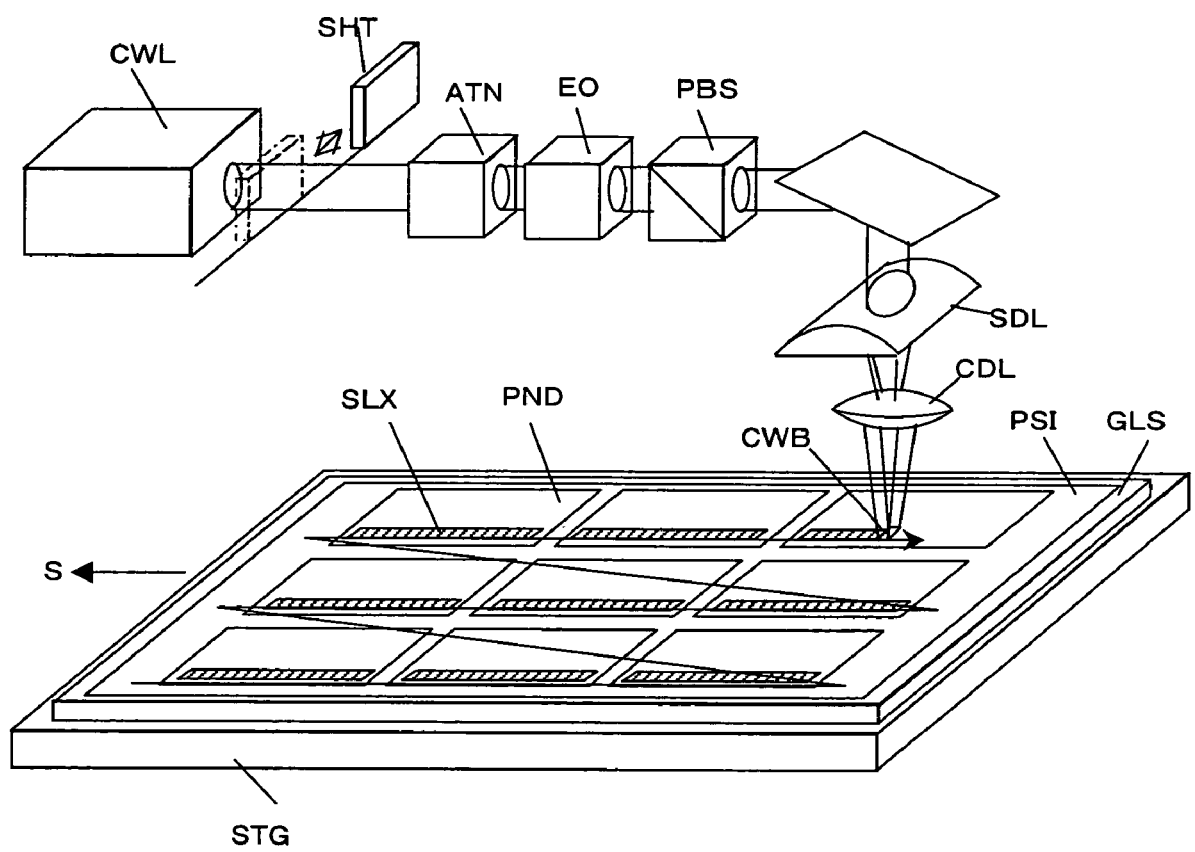
FIG. 1 is a perspective view for explaining a method for manufacturing semiconductor devices according to the present invention.
Figure 2:
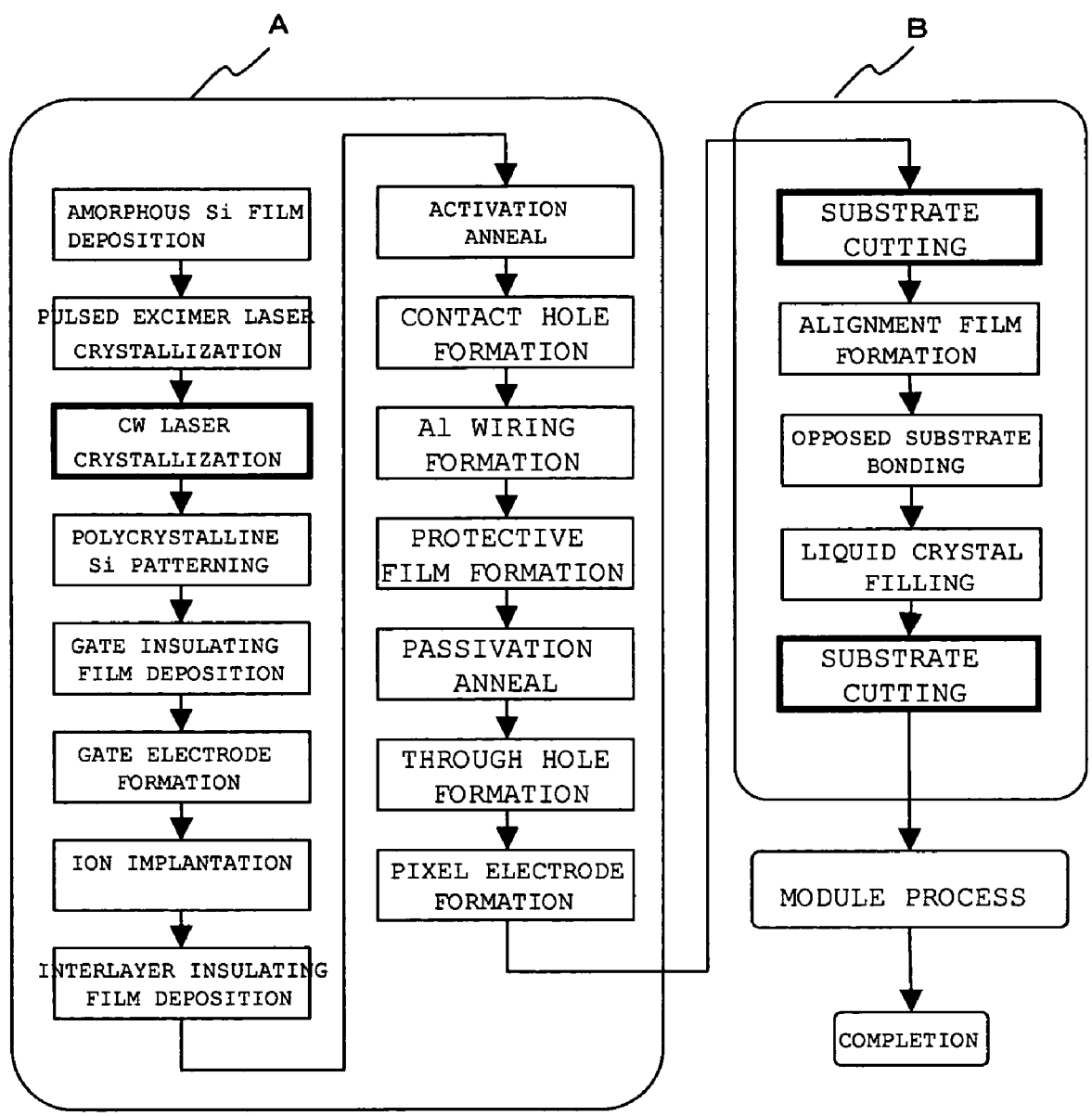
FIG. 2 is a flow chart for explaining a manufacturing process of the semiconductor devices according to the present invention.

FIG. 1 is a perspective view for explaining a method for manufacturing semiconductor devices according to the present invention. FIG. 2 is a process chart for explaining the manufacturing process of the semiconductor devices according to the present invention. In FIG. 1, a glass substrate GLS mounted on a stage STG has a strain point of 670° C. and a thickness of 0.4 mm. An undercoat insulating film UDC made of a lamination of a silicon nitride (SiN) layer and a silicon oxide (SiO) layer having a thickness of 140 nm and a thickness of 100 nm respectively, and an amorphous Si film having a thickness of 50 nm are deposited on the glass substrate GLS sequentially by a plasma CVD method.

Hydrogen in the amorphous Si is reduced by annealing at 400° C. After that, the whole surface of the amorphous Si film is irradiated with a pulsed excimer laser beam so that the amorphous Si film is crystallized into a polycrystalline Si film PSI. Further, the polycrystalline Si film PSI on the substrate is irradiated with a CW laser beam CWB having a wavelength of 532 nm while the substrate is scanned therewith. Thus, a semiconductor film SLX having crystals grown laterally (in the scanning direction) is formed.

The CW laser beam is turned off in a boundary portion between adjacent ones of a plurality of regions PND formed on the substrate and serving as semiconductor devices. Thus, the polycrystalline Si film PSI is not irradiated in such boundary portions. A region excluding the boundary portions is irradiated with the CW laser beam continuously so that a polycrystalline Si film SLX made of Si crystals grown laterally is formed like a belt.

A solid-state laser unit is used as a laser unit CWL. In the solid-state laser unit, a laser beam having a wavelength of 1,064 nm and obtained from a YVO crystal excited by a semiconductor laser is converted into a beam having a wavelength of 532 nm by an SHG (Secondary Harmonics Generation) wavelength converting device, and the beam with a wavelength of 532 nm is output. When processing is not performed between scans or between substrates, the laser beam is blocked by a shutter SHT so as not to be output. Each scan is performed in the state where the shutter SHT is placed out of an optical path so as to open the optical path. The laser beam from the laser unit CWL has a constant energy, and the power of the laser beam is regulated by controlling the transmittance of an attenuator ATN. The laser beam is deformed into a so-called line beam shape shorter in a scanning direction S by a cylindrical lens SDL. The laser beam is further shaped into a predetermined beam size by a lens CDL so as to be applied on the substrate GLS.

An electro-optic device EO and a polarizing beam splitter PBS are inserted into the optical path. A plane of polarization of the transmitted laser beam is rotated in accordance with an electric signal to the electro-optic device EO. Thus, the transmittance of the polarizing beam splitter PBS is changed to modulate the intensity of the laser beam. An input to the electro-optic device EO is controlled in connection with the scanning of the stage STG mounted with the substrate GLS, so that the transmittance of the polarizing beam splitter PBS is zero near the boundary between adjacent devices. Thus, the irradiation with the CW laser beam in each boundary between adjacent ones of the devices is turned off, as shown in FIG. 1.

The electro-optic device can switch quickly in a short time of about a microsecond. The electro-optic device can switch irradiation on/off with a width not longer than 0.1 mm even in a fast scan speed not lower than 1 m/sec. As well as the method of modulation using the electro-optic device, it is also possible to use a known modulation method such as a method using a rotary shutter working with movement of the substrate stage, a method for modulating the oscillation output of the CW laser CWL directly, etc. Although the CW laser beam is turned off perfectly near the boundary between adjacent ones of the devices in this embodiment, the CW laser beam may be instead made weak enough to prevent lateral growth. Also in this case, similar effect can be obtained.

After the process of crystallization using the CW laser, semiconductor devices are formed along the processes shown in FIG. 2. In this embodiment, transmissive liquid crystal display devices will be illustrated by way of example. First, a TFT substrate is formed in a process group A (also referred to as a thin film transistor substrate forming process or a TFT process) of FIG. 2. In the process group A, an amorphous Si film is deposited on a substrate (amorphous Si film deposition), and crystallized by a pulsed excimer laser (pulsed excimer laser crystallization). Further, this crystallized Si film is irradiated with a CW laser beam while being scanned therewith, so that a polycrystalline Si film grown in the scanning direction of the CW laser beam is formed (CW laser crystallization).

The polycrystalline Si film is patterned by a photolithographic method (hereinafter referred to as photolithography) (polycrystalline Si patterning). After that, a gate insulating film is deposited (gate insulating film deposition). Further, a metal film made of MoW is deposited thereon by sputtering, and patterned into gate electrodes by photolithography. In this event, gate wiring is also formed (gate electrode formation).

Next, a resist is used as a mask to inject impurities made of phosphorous (P) and boron (B) into predetermined positions (ion implantation). After that, an interlayer insulating film made of SiO is deposited by plasma CVD (interlayer insulating film deposition). The laminate obtained thus is annealed at 500° C. so that the injected impurities are activated to form sources and drains of TFTs (activation anneal). Contact holes with the sources/drains and gate electrodes are opened by etching the interlayer insulating film and the gate insulating film (contact hole formation).

Further, a metal film made of a lamination of MoW and Al is deposited by sputtering, and Al wiring is formed by use of photolithography (Al wiring formation). Further, a protective film made of SiN is deposited by use of plasma CVD (protective film deposition), and a passivation process (passivation anneal) is performed by annealing at 400° C. Further, the SiN protective film in through holes of pixel portions and terminal portions are opened (through hole formation). After that, a transparent electrode made of ITO is deposited by sputtering, and patterned into pixel electrodes by photolithography (pixel electrode formation). As a result of the aforementioned processes, pixels forming a display region (pixel region) are formed, and circuits for driving the pixels are formed outside the pixel region.

Figure 3:
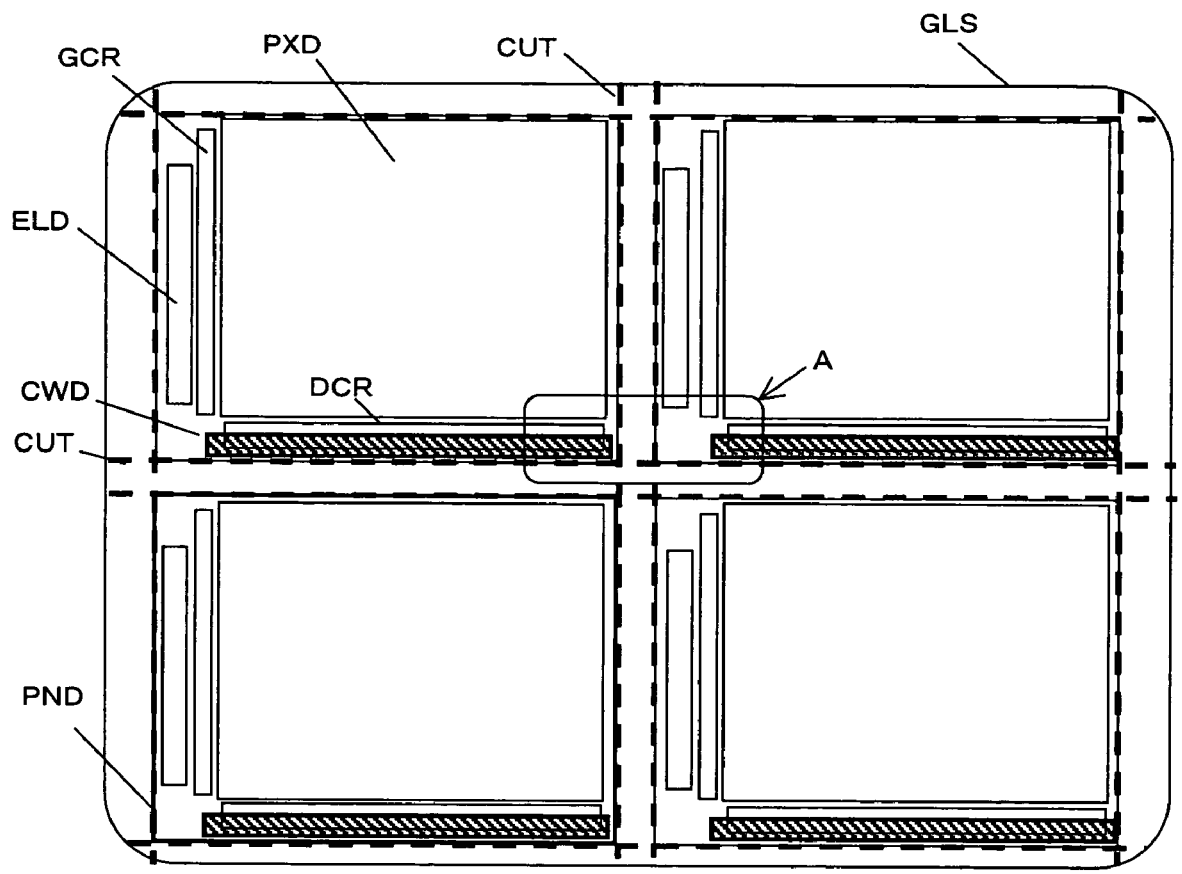
FIG. 3 is a partial view for explaining a configuration of a TFT substrate manufactured in a TFT process.

FIG. 3 is a partial view for explaining the configuration of the TFT substrate manufactured in the TFT process. In FIG. 3, a plurality of regions PND which will serve as semiconductor devices (individual TFT substrates here) are formed on the substrate GLS. Each region PND shown by the thin solid lines is separated by a substrate cutting position CUT shown by the thick broken lines. Each region is provided with a pixel region PXD where pixels for displaying an image are formed, circuit regions GCR and DCR for driving the pixels, and a terminal region ELD where connection terminals are formed.

The circuit region GCR is a region (gate line driving circuit region) to be provided with a gate line driving circuit for applying a scan signal to a gate line. The circuit region DCR is a region (signal line driving circuit region) to be provided with a signal line driving circuit for supplying a display signal to a signal line. TFTs using a polycrystalline Si film which has not been irradiated with the CW laser beam are formed in the pixel region PXD and the gate line driving circuit region GCR. A region CWD irradiated with the CW laser beam is formed in a part of the signal line driving circuit region DCR so that TFTs using a polycrystalline Si film made of crystals grown laterally are formed.

Figure 4:
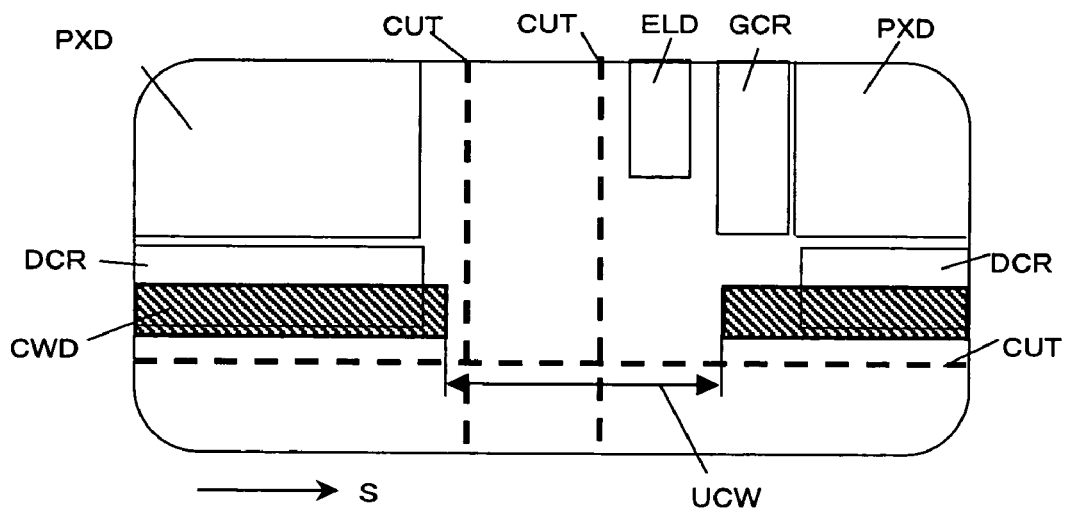
FIG. 4 is an enlarged view of a portion A in and near the center of FIG. 3.

FIG. 4 is an enlarged view of a portion A in and near the center of FIG. 3. A region UCW which has not been irradiated with the CW laser beam is provided in the substrate cutting position CUT. After the TFT substrate is formed, the substrate is cut into a plurality of groups (substrate cutting) in the process group B (panel assembling process) of FIG. 2. An alignment film is applied and dried for alignment (alignment film formation). An opposed substrate is bonded (opposed substrate bonding), and liquid crystals are filled (liquid crystal fill). After that, the substrate lamination is cut into individual substrates and divided into respective semiconductor devices (substrate cutting) so as to be formed as liquid crystal panels. After that, semiconductor devices serving as transmissive liquid crystal display devices are completed through a module process for connection of terminal portions of each liquid crystal panel and combination with a backlight. There is another method in which liquid crystals are dropped onto the TFT substrate before the opposed substrate is bonded. Alternatively, the second substrate cutting process may be performed before injection of the liquid crystals.

The substrate cutting processes in FIG. 2 include a process for dividing the initial glass substrate (mother glass) into proper-size substrates in the process group A, and a process for dividing each substrate into final devices after bonding an opposed substrate thereto in the process group B. In each substrate cutting process, the cutting region CUT of the TFT substrate is set not to cross any region irradiated with the CW laser beam.

In the manufacturing process according to this embodiment, the regions which correspond to peripheries of semiconductor devices and where the substrate will be cut are not irradiated with the CW laser beam. It is therefore possible to suppress a failure such as disconnection caused by very small cracks occurring at the time of substrate cutting and propagating over the regions irradiated with the CW laser beam. The cracks stop at a distance of about 10 μm in the regions which have not been irradiated with the CW laser beam. In consideration of the reduction caused by grinding of each end surface after cutting, an unirradiated region as wide as the thickness of the substrate or not narrower than 0.4 mm in this embodiment may be provided near the cut surface of the substrate. Thus, it is possible to suppress propagation of cracks to the regions irradiated with the CW laser beam when the substrate is cut or when the end surface thereof is then ground.

In this embodiment, the terminal portion for connecting the substrate and the outside is also designed not to be irradiated with the CW laser beam. Accordingly, it is also possible to prevent cracks from occurring due to stress when a flexible printed circuit board which is a wiring board is pressure-bonded with the terminal portion.

A transmissive liquid crystal display device has been described as a semiconductor device in this embodiment by way of example. The same thing can be applied to a reflective liquid crystal display device or a semi-trans reflective liquid crystal display device where reflective pixels are formed partially. In addition, the same thing can be applied to a display panel having pixels of organic EL used in place of liquid crystals. In the case of a display panel having organic EL pixels, a substrate is cut before or after an organic EL layer process or a sealing process instead of the liquid crystal process. In this case, the cutting position is disposed not to be irradiated with the CW laser beam in the same manner as in FIG. 3. Thus, a failure caused by cracks can be prevented.

In this embodiment, the unirradiated region UCW is provided to include the substrate cutting position CUT. The unirradiated region UCW does not have to include the cutting position, but may be provided between the cutting position CUT and the circuit region DCR. Cracks occurring due to substrate cutting stop in the unirradiated region. It is therefore possible to suppress propagation of the cracks to the circuit region. Thus, a failure such as disconnection can be prevented.

Second Embodiment

Figure 5:
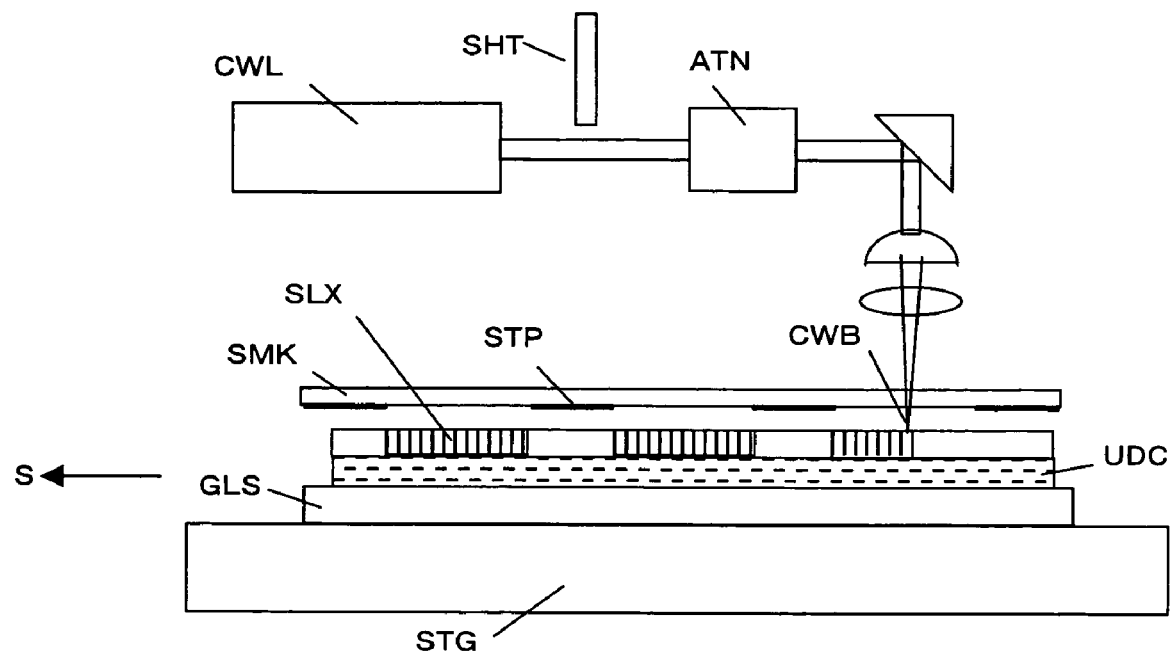
FIG. 5 is a side view for explaining a second embodiment of the method for manufacturing semiconductor devices according to the present invention.
Figure 6:
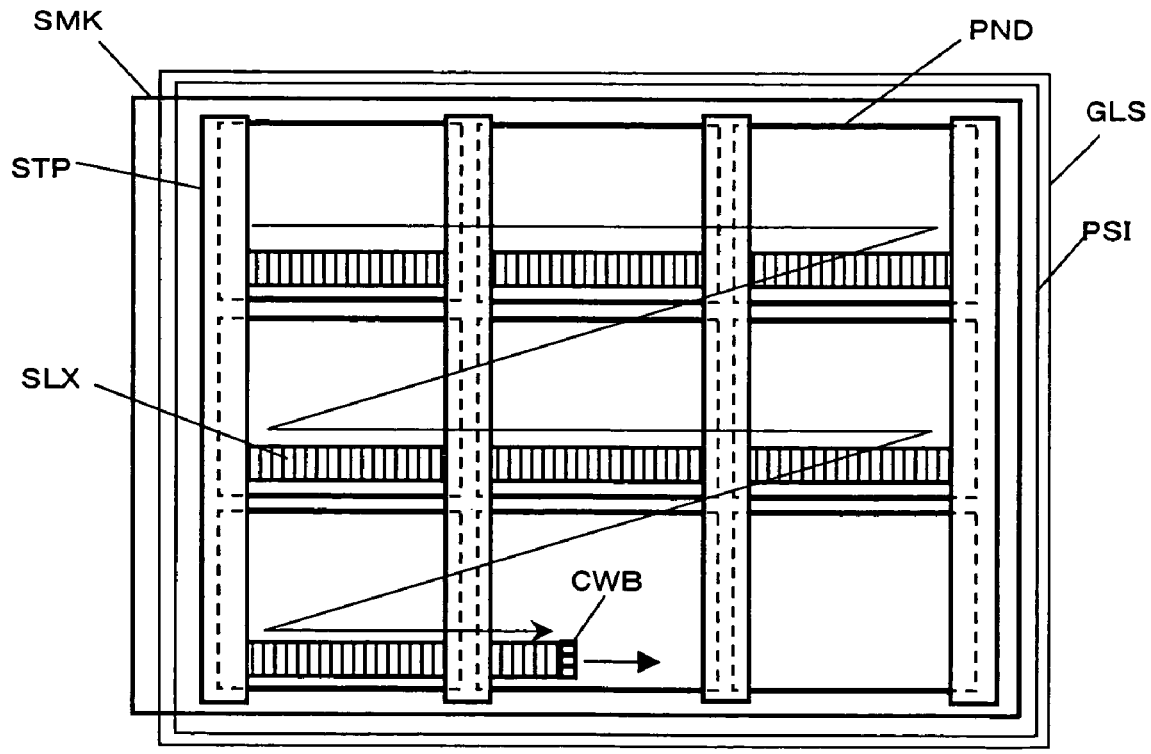
FIG. 6 is a plan view of FIG. 5, for explaining the second embodiment of the method for manufacturing semiconductor devices according to the present invention.

FIG. 5 is a side view for explaining a second embodiment of a method for manufacturing semiconductor devices according to the present invention. FIG. 6 is a plan view of FIG. 5, for explaining the second embodiment of the method for manufacturing semiconductor devices according to the present invention. Parts having the same functions as those in FIG. 1 are referenced correspondingly. In FIGS. 5 and 6, a mask SMK for blocking light in boundaries between adjacent ones of semiconductor devices is provided closely to a substrate GLS where a semiconductor film PSI having Si as its chief component is formed. The substrate GLS is irradiated with a CW laser beam CWB while being scanned therewith in a direction S with the relative position between the substrate GLS and the mask SMK being kept constant.

Due to this scan, only the vicinities of the boundaries among the semiconductor devices are shielded from light by a mask pattern STP, while the semiconductor film PSI in the other regions is formed into a semiconductor film SLX made of crystals grown laterally. In the method according to this embodiment, a mechanism for quickly switching the intensity of the laser beam emitted from the CW laser CWL becomes dispensable so that the manufacturing apparatus can be simplified. In addition, the mask SMK serving for light shielding and provided above the glass substrate having high transmittance with respect to the laser beam can be formed easily by patterning a film of Al or the like having high reflectivity with respect to the laser beam. The light shielding pattern STP does not have to be perfectly opaque. It will go well as long as the light shielding pattern STP can attenuate the intensity of the laser beam to power low enough to prevent lateral growth.

In each of the first embodiment described with reference to FIG. 1 and the second embodiment described with reference to FIG. 5, the CW laser beam does not have to have a wavelength of 532 nm. It is also possible to use a shorter-wavelength laser beam with respect to which the semiconductor film having Si as its chief component has a higher absorption coefficient. For example, a laser beam with a wavelength of 408 nm may be used. The laser unit CWL does not have to be a solid-state laser using wavelength conversion as described above. A GaN-based semiconductor laser may be used as the laser unit CWL. A plurality of laser units arranged in parallel may be used in place of the single laser unit. A so-called pseudo-CW laser whose oscillation frequency is not lower than several tens of MHz may be used in place of the CW laser. The beam shape of the laser beam on the substrate does not have to be linear. A round shape or the like may be used as the beam shape. When the beam is shaped to be linear as in this embodiment, the range where crystallization can be attained by one-time irradiation can be expanded if the laser power is constant.

The modulation of the CW laser beam on the glass substrate may be replaced by the method in which the undercoat film and/or the semiconductor film are patterned to reduce the absorption coefficient near the cutting position of each semiconductor device. Also in this case, it is possible to obtain an effect similar to that in the case where the vicinities of the substrate cutting position are not irradiated with the CW laser beam.

Figure 7:
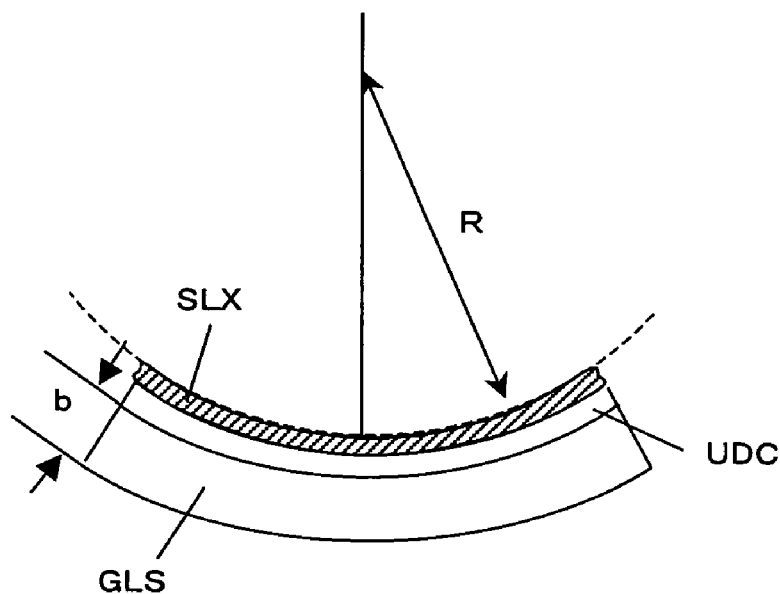
FIG. 7 is a view for explaining a method for measuring tensile stress of a substrate relevant to propagation of cracks.

FIG. 7 is a view for explaining a method for measuring the tensile stress of the substrate relevant to propagation of cracks. The substrate is deformed to be concave up due to the tensile stress of the substrate surface. As for deformation of a disc-like substrate, tensile stress S is calculated from a curvature radius R as shown in Expression 1 (see Sadafumi Yoshida, "Thin Film", Baifukan, 1990).

$$S = E \cdot b^2 / (6(1-v)R) \quad \text{(Expression 1)}$$

where E designates Young's modulus of the substrate; b, thickness of the substrate; and v, Poisson's ratio of the substrate.

Table 1 shows the tensile stress of the substrate surface measured in the method shown in FIG. 7, and the condition of cracks occurring when the substrate was cut.

TABLE 1

| sample | laser irradiation conditions | | tensile stress (N/m) | | crack propagation |
|---|---|---|---|---|---|
| | scanning speed (mm/sec) | power (arb.unit) | absolute value | increment | |
| A | 200 | 4 | 870 | 220 | yes |
| | | 3 | 740 | 90 | no |
| | | unirradiated | 650 | — | no |
| B | 500 | 9 | 870 | 260 | yes |
| | | 7 | 740 | 130 | no |
| | | unirradiated | 610 | — | no |
| C | 800 | 9.6 | 870 | 230 | yes |
| | | 8 | 750 | 110 | no |
| | | unirradiated | 640 | — | no |

In this test, a glass substrate of $E=7.74 \times 10^{10}$ Pa and $v=0.22$ was used. An SiN film 140 nm thick, an SiO film 100 nm thick and an amorphous Si film 50 nm thick were deposited in turn on the glass substrate, and crystallized by a pulsed excimer laser beam so that a polycrystalline Si film was formed. After that, the polycrystalline Si film was irradiated with a CW laser beam. The wavelength of the CW laser beam used here was 532 nm. The irradiation was performed with the beam with a line beam shape having a short-side width of 7 μm. After the irradiation, the back surface of the substrate was ground so that the substrate was about 100 μm thick. Then, the curvature radius R was measured. A focal length $f$ of the substrate surface serving as a concave mirror was measured optically, and the curvature radius R was obtained by the relation $R=2f$.

The curvature radius may be measured not by this method but by a known method such as a method for hitting a laser beam on the surface and detecting a change of the angle of reflected light thereof for each irradiation position, a method for evaluating the surface shape of the substrate using interference fringes, a method for measuring the shape of the substrate directly by a stylus method, a method for obtaining the surface shape by a non-contact displacement gauge using a confocal scanning microscope, or the like.

In the region irradiated with the CW laser beam, the tensile stress increased as compared with the region which was not irradiated. The increment of the tensile stress depended on the irradiation conditions of the CW laser beam. With increase in irradiation power and with reduction in scanning speed, the tensile stress increased. It is conceived that this is because heat penetrated the substrate more deeply to increase residual stress as the irradiation power was higher and the heating time per unit area was longer due to the smaller speed. When the substrate surface was ground and removed by about 1 μm, the warp of the substrate was substantially removed. It is therefore conceived that the stress concentrated in a range about 1 μm deep from the substrate surface.

Cracks occurring when the substrate was cut were observed by a microscope. As a result, the cracks propagated from the cutting position to the irradiated region when the tensile stress was not lower than 750 N/m, that is, when the increment of the tensile stress between before and after the irradiation was not lower than 200 N/m. No propagation of the cracks could be recognized when the tensile stress was lower than that value.

According to each embodiment of the present invention, the increment of tensile stress in the substrate surface caused by irradiation with a CW laser beam and leading to propagation of cracks is made not higher than 200 N/m. Thus, even if the region irradiated with the CW laser beam is cut, occurrence of propagation of the cracks can be suppressed so that a failure can be prevented from occurring.

Figure 8:
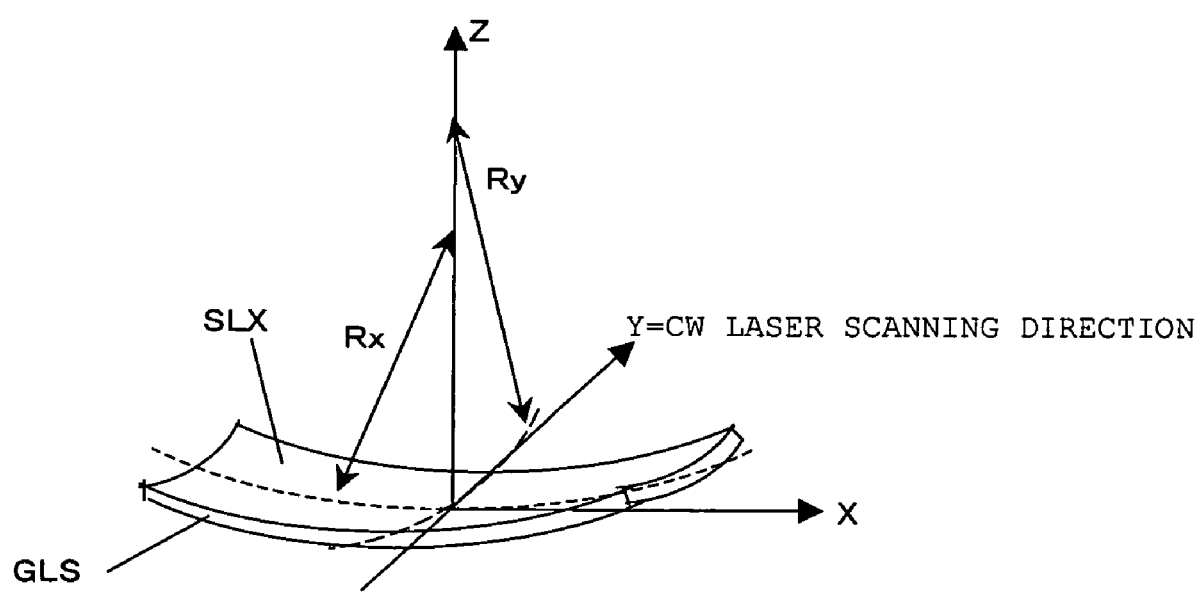
FIG. 8 is a view for further explaining the method for measuring tensile stress of the substrate relevant to propagation of cracks.

FIG. 8 is a view for further explaining the method for measuring the tensile stress of the substrate relevant to propagation of cracks. In a region irradiated with the CW laser beam, as shown in FIG. 8, it was observed that a curvature radius Rx in a direction perpendicular to the scanning direction became smaller than a curvature radius Ry in the scanning direction. When the tensile stress has anisotropy, its corresponding curvature radius R also has anisotropy. When the curvature radii in the respective directions are expressed by Rx and Ry, tensile stress tensors Sxx and Syy in the respective directions are calculated by the following Expressions 2.

$$Sxx = Eb^2 (1/Rx + v/Ry)/(6(1-v^2))$$

$$Syy = Eb^2 (1/Ry + v/Rx)/(6(1-v^2)) \quad \text{Expressions 2}$$

Figure 21:
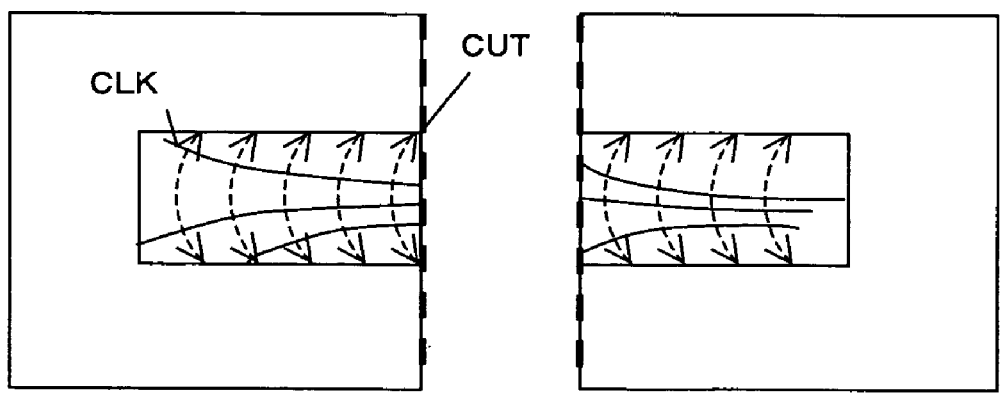
FIG. 21 is a view for explaining the state where cracks propagate due to the cutting of the substrate.

Since the Poisson's ratio v is smaller than 1, the tensile stress tensor in the x-direction where the curvature radius is smaller is larger than that in the y-direction based on Expressions 2. This means that there occurs tensile stress in a direction perpendicular to the scanning direction. The direction of the surface stress is qualitatively consistent with the direction of residual stress estimated from the propagation direction of a crack CLK shown in FIG. 21. It is suggested that the crack is caused by the tensile stress near the surface.

When Rx is substantially equal to Ry, and when the Poisson's ratio v is sufficiently small, Expressions 2 are substantially approximated to Expression 1 for the respective x- and y-directions. In Table 1, a value of a curvature radius in the direction where the curvature radius was smaller was substituted in Expression 1 so as to obtain the tensile stress. No anisotropy was observed in any region that was not irradiated with the CW laser beam.

When only the polycrystalline Si film was etched, the tensile stress was slightly reduced both in the region which was irradiated with the CW laser beam and in the region which was not irradiated therewith. However, the difference in tensile stress between the regions was substantially equal to that before etching. On the other hand, when the substrate surface including the undercoat film and the glass substrate under the undercoat film was etched by about 1 μm or more, the tensile stress was substantially cancelled both in the region which was irradiated with the CW laser beam and in the region which was not irradiated therewith.

An insulating film made of a silicon oxide SiO film 0.5 μm thick was deposited by plasma CVD on a region irradiated with the CW laser beam in the conditions that the increment of tensile stress would be not lower than 200 N/m, so that cracks would propagate. Even when the substrate was cut after that, propagation of the cracks was not observed.

From the aforementioned result, it is conceived that the tensile stress caused by the irradiation with the CW laser beam occurs in the surface of the glass substrate, depending on anisotropic residual stress at the time of heating and cooling. The residual stress is generated when the substrate surface is softened due to the irradiation with the CW laser beam and the substrate surface shrinks due to cooling then. When a quartz substrate having a low coefficient of thermal expansion and a high strain point of about 1,000° C. is used, softening due to heating hardly occurs. Thus, the residual stress can be lowered so that cracks can be suppressed. However, the quartz substrate is expensive. It is therefore desired to use a lower-priced glass substrate. A glass substrate obtained at a comparatively low price has a strain point at 750° C. or lower. Thus, softening occurs in the substrate surface easily due to irradiation with the CW laser beam. It is likely that cracks may propagate due to the residual tensile stress caused by the heat shrinkage after cooling.

It is also conceived that the cracks expand left and right due to anisotropic residual tensile stress in the irradiated region so that the stress propagates to be concentrated in the front end. When a silicon oxide film having enough strength to suppress the expansion of the cracks, for example, a silicon oxide film having a thickness of 0.5 μm or more is provided in the surface of the substrate, it is possible to suppress the propagation of the cracks.

Third Embodiment

Figure 9:
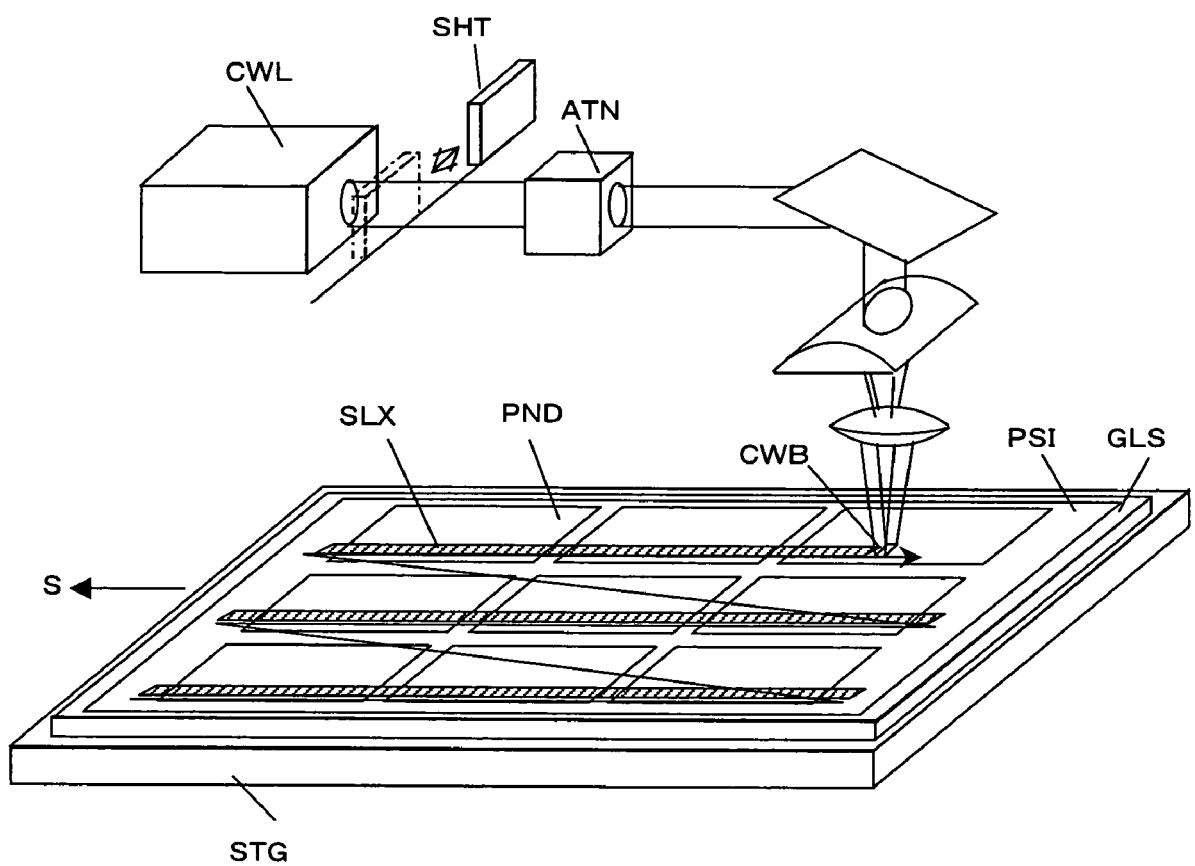
FIG. 9 is a perspective view for explaining a third embodiment of the method for manufacturing semiconductor devices according to the present invention.

FIG. 9 is a perspective view for explaining a third embodiment of a method for manufacturing semiconductor devices according to the present invention. A glass substrate GLS including boundaries among regions PND serving as semiconductor devices, that is, display panels, is continuously irradiated with a CW laser beam CWB while being scanned therewith linearly in a direction S. The irradiation conditions of the CW laser beam are, for example, set so that the substrate scanning speed is 500 mm/sec, and the laser power is 7 in Table 1, so that the increment of tensile stress will be not higher than 200 N/m.

After the CW laser beam irradiation process, semiconductor devices are formed in a process including substrate cutting in the same manner as in the description of FIG. 2. In the manufacturing method according to this embodiment, propagation of cracks can be suppressed even if a region irradiated with the CW laser beam is cut. It is therefore possible to continuously irradiate the glass substrate GLS including boundaries among the semiconductor devices with the CW laser beam. Accordingly, it is not necessary to turn off the CW laser beam near the boundaries among the semiconductor devices, and it is not necessary to align the substrate in the scanning direction. In addition, a failure caused by misalignment can be suppressed. Thus, the yield is improved as compared with that in the first embodiment described with reference to FIG. 1. In addition, a fast shutter mechanism is dispensable. Thus, there is an advantage that the apparatus can be simplified.

In this embodiment, the boundaries among the regions serving as the semiconductor devices are also irradiated continuously with the CW laser beam. However, regions not to be irradiated with the CW laser beam may be provided in the boundaries among the semiconductor-device regions as shown in FIG. 1, while the conditions are still set such that the increment of stress caused by the irradiation of the CW laser beam will be not higher than 200 N/m. As for the method for adjusting the increment of stress, it is also possible to use a method for changing the thickness or configuration of the undercoat film between the semiconductor film and the glass substrate so as to suppress heat conduction to the glass substrate during the irradiation with the CW laser beam, as well as the method for adjusting the conditions of the irradiation with the CW laser beam.

Figure 10:
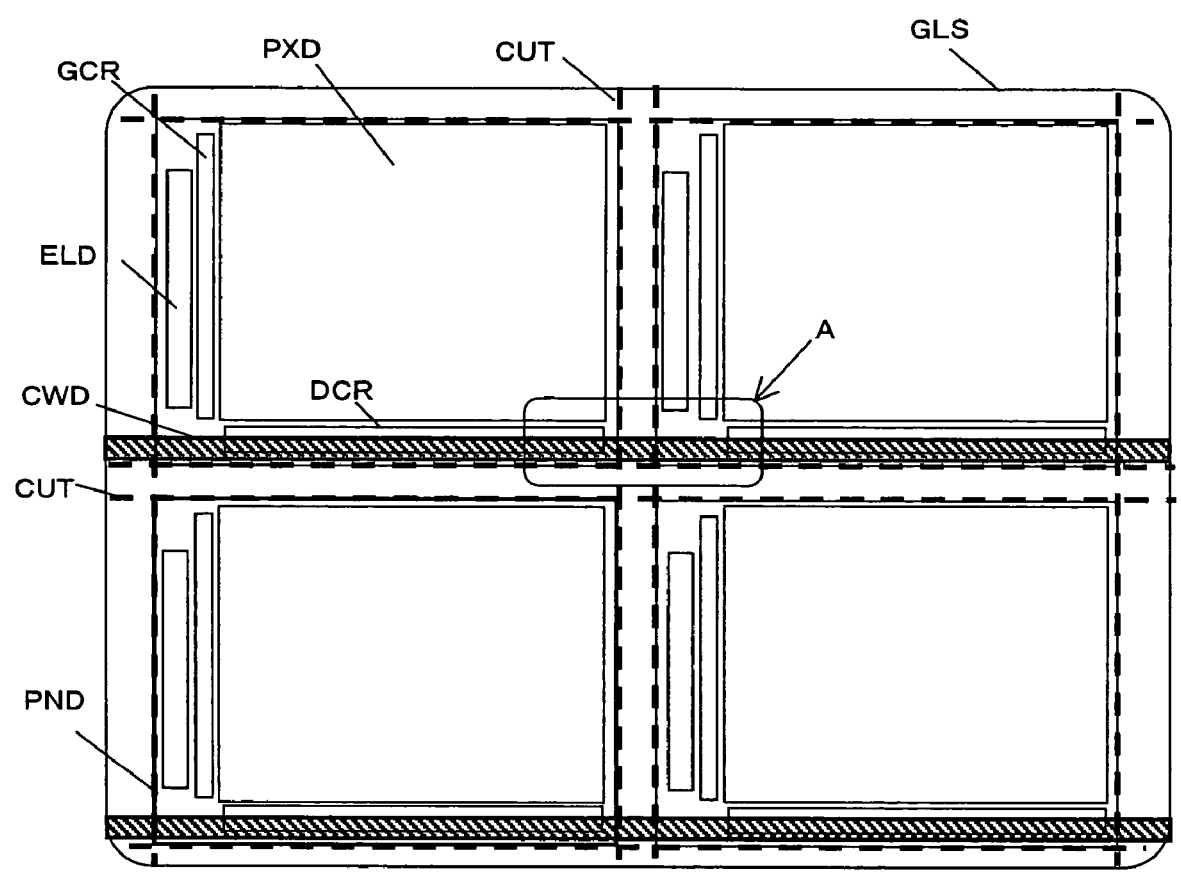
FIG. 10 is a plan view similar to FIG. 3, for explaining an example of a TFT substrate serving as semiconductor devices manufactured according to the third embodiment of the present invention.
Figure 11:
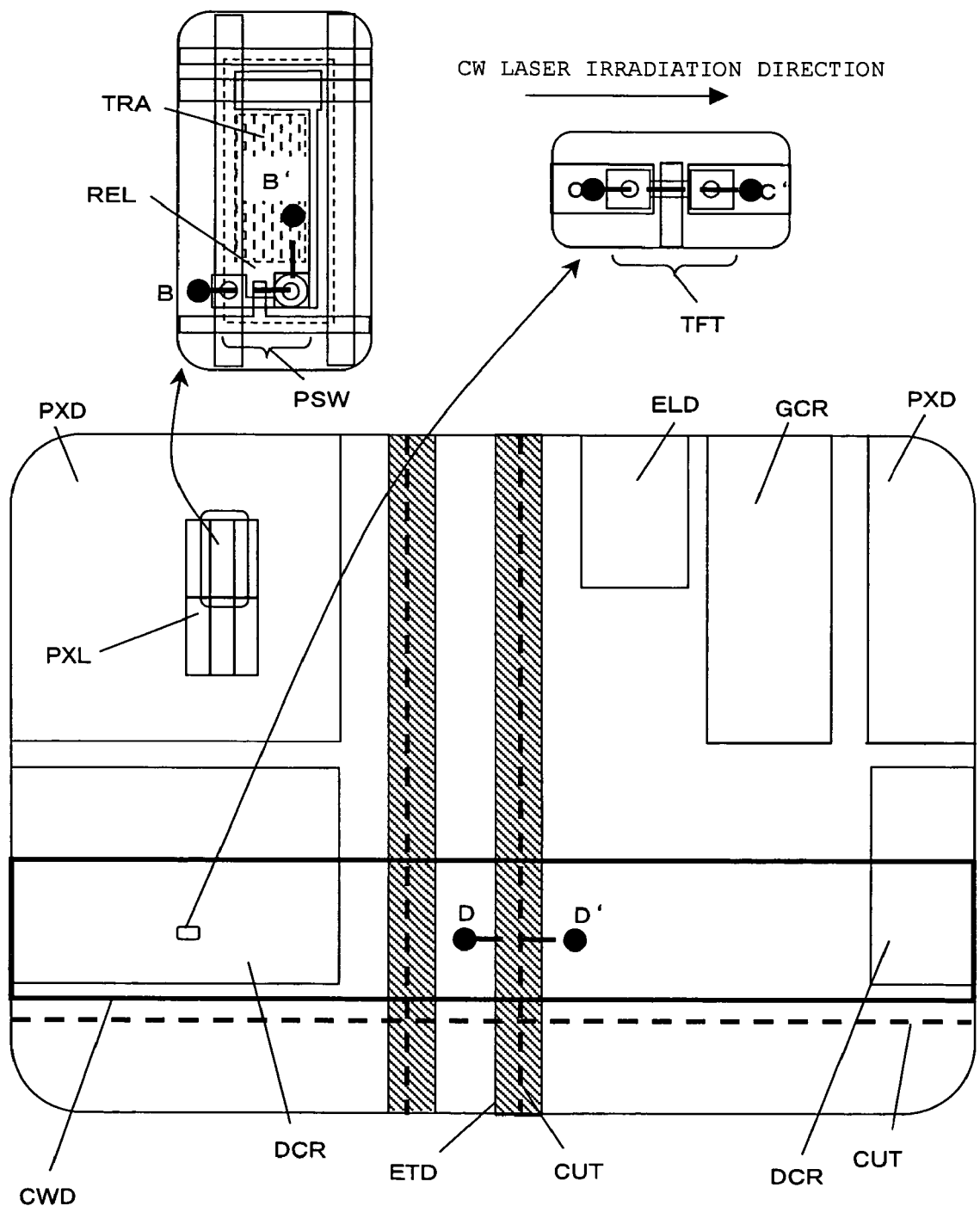
FIG. 11 is an enlarged view of a portion A in and near the center of FIG. 10.

FIG. 10 is a plan view similar to FIG. 3, for explaining an example of a TFT substrate serving as semiconductor devices and manufactured according to the third embodiment of the present invention. In the same manner as in FIG. 9, continuous CW laser beam irradiation regions CWD are provided to include boundaries among regions PND serving as semiconductor devices respectively. FIG. 11 is an enlarged view of a portion A in and near the center of FIG. 10. Glass substrate etching regions ETD are provided in regions including the portions where the substrate cutting positions CUT cross the CW laser beam irradiation regions CWD respectively.

Figure 12:
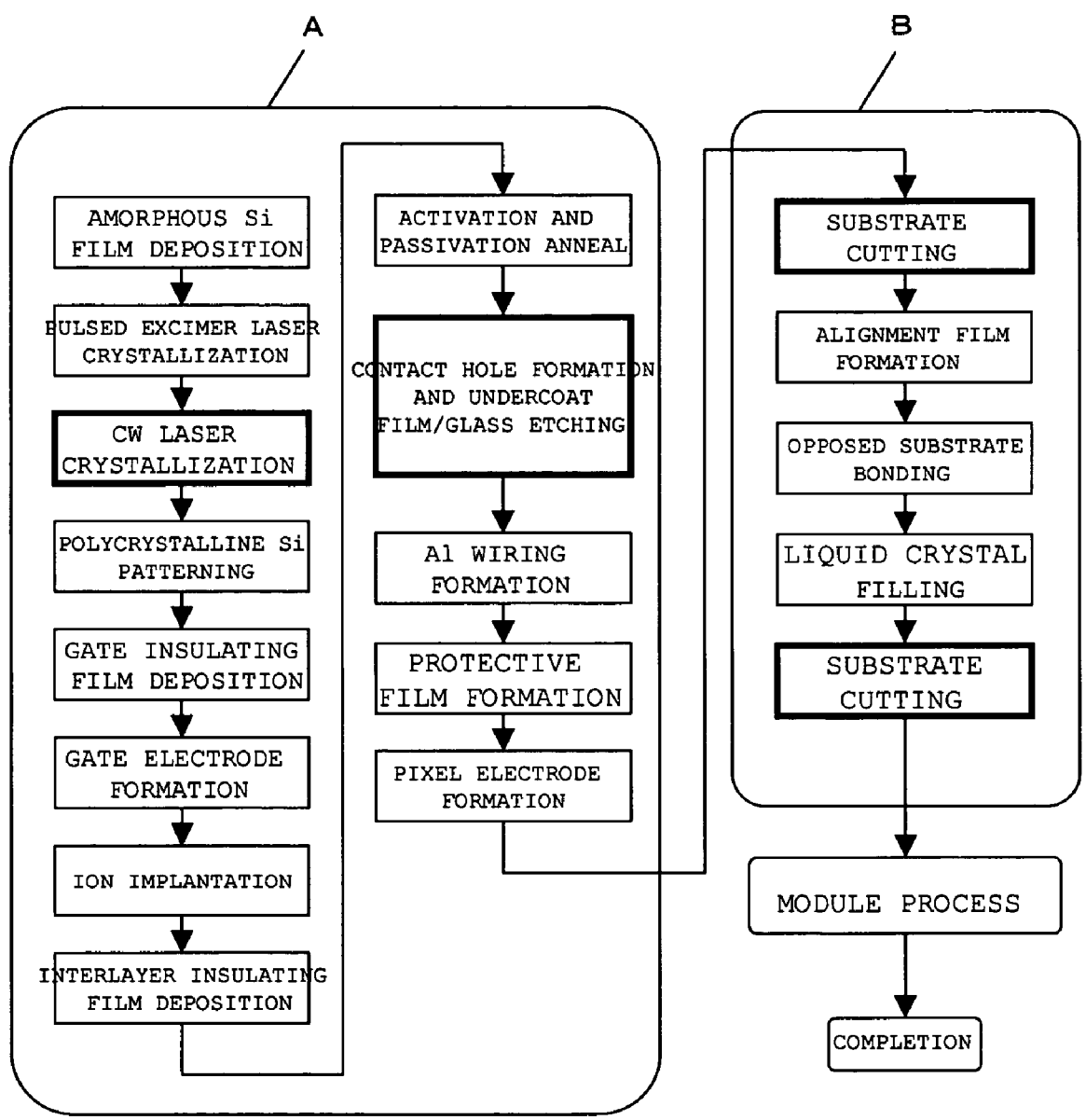
FIG. 12 is a flow chart for explaining a manufacturing process of the semiconductor devices shown in FIG. 10 and according to the third embodiment of the present invention.

FIG. 12 is a flow chart for explaining the manufacturing process of semiconductor devices shown in FIG. 10 and according to the third embodiment of the present invention. Here is shown the case of manufacturing display panels for forming so-called trans reflective liquid crystal display devices in which transmitted light and reflected light are controlled to display images. In FIG. 12, a TFT substrate is formed by a process group A (a thin film transistor substrate formation process or a TFT process). In the process group A, an amorphous Si film is formed on the substrate (amorphous Si film deposition), and crystallized by a pulsed excimer laser (pulsed excimer laser crystallization). Further, this crystallized Si film is irradiated with a CW laser beam while being scanned therewith, so that a polycrystalline Si film grown in the scanning direction of the CW laser beam is formed (CW laser crystallization).

The polycrystalline Si film is patterned by photolithography (polycrystalline Si patterning). After that, a gate insulating film is deposited (gate insulating film deposition). Further, a metal film made of MoW is deposited thereon by sputtering, and processed into gate electrodes by photolithography. In this event, gate wiring is also formed (gate electrode formation).

Next, a resist is used as a mask to inplant impurities made of phosphorous (P) and boron (B) into predetermined positions (impurities implantation). After that, an interlayer insulating film made of a lamination of SiO and SiN is deposited by plasma CVD (interlayer insulating film deposition). The laminate obtained thus is annealed at 420° C. so that the injected impurities are activated to form sources and drains of TFTs, and a passivation process is performed concurrently (activation and passivation annealing). Contact holes with the sources/drains and gate electrodes are opened by etching the interlayer insulating film and the gate insulating film. At the same time that the contact holes are formed, the undercoat film and the surfaces of the glass substrate are etched (contact hole formation and undercoat film/glass etching).

Further, a metal film made of a lamination of MoW and Al is deposited by sputtering, and Al wiring is formed by use of photolithography (Al wiring formation). A termination process is performed by annealing at 400° C. if necessary. Further, a photosensitive organic film is applied, exposed to light, and developed to form an organic protective film opened in through holes of pixel portions and terminal portions. Further, a transparent electrode made of ITO and a reflecting electrode made of a lamination of MoW and an Ag alloy are deposited by sputtering, and patterned into pixel electrodes by photolithography (pixel electrode patterning). As a result of the aforementioned processes, pixels pattening a display region (pixel region) are formed, and circuits for driving the pixels are formed outside the pixel region. A process group B is similar to that of FIG. 2. Therefore, the process group B will not be described redundantly.

Figure 13A:
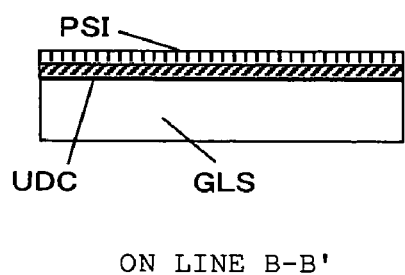
FIGS. 13A-13C are schematic sectional views for further explaining the TFT process in FIG. 12.
Figure 13B:
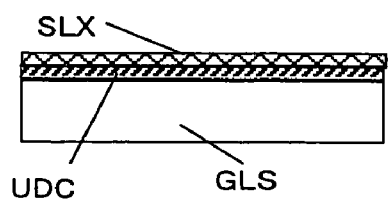
Figure 13C:
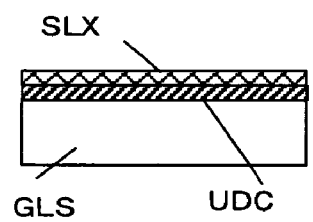
Figure 14A:
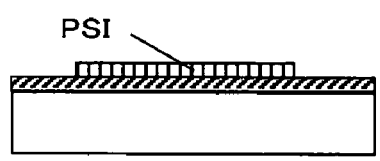
FIGS. 14A-14C are schematic sectional views following FIGS. 13A-13C, for further explaining the TFT process in FIG. 12.
Figure 14B:
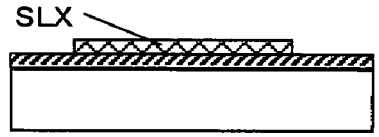
Figure 14C:
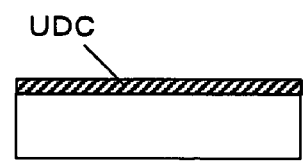

FIGS. 13A-13C to 17A-17C are schematic sectional views for further explaining the TFT process in FIG. 12. FIGS. 13A-17A, 13B-17B and 13C-17C correspond to sections taken on line B-B', line C-C' and line D-D' in FIG. 11 respectively. In FIGS. 13A-13C, tensile stress leading to cracks is relaxed in the region ETD where the undercoat film UDC and the surface of the glass substrate GLS are etched, so that cracks can be suppressed even if the region designated by CUT is cut.

An amorphous Si film 60 nm thick is deposited on the glass substrate GLS having a strain point at 635° C., through the undercoat film UDC made of SiN 50 nm thick and SiO 100 nm thick. The whole surface of the amorphous Si film is crystallized by use of a pulsed excimer laser so as to be formed into a polycrystalline Si film PSI. After that, the polycrystalline Si film PSI is irradiated with a CW laser beam so as to grow Si crystals laterally while the substrate is scanned therewith, as shown in FIG. 9. Thus, the polycrystalline Si film PSI in the circuit regions and the boundary regions is formed into a semiconductor film SLX made of crystals grown laterally.

Figure 15A:
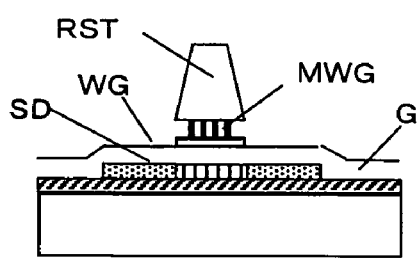
FIGS. 15A-15C are schematic sectional views following FIGS. 14A-14C, for further explaining the TFT process in FIG. 12.
Figure 15B:
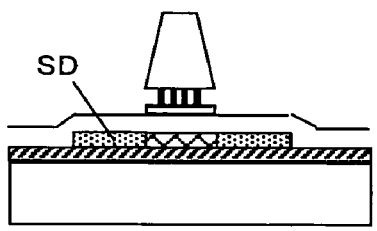
Figure 15C:
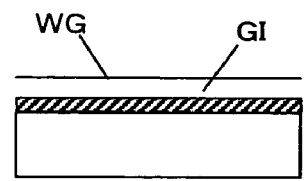

On the other hand, the polycrystalline Si film PSI in the pixel regions is not irradiated with the CW laser beam. The polycrystalline Si film PSI and the semiconductor film SLX are processed by photolithography so as to be shaped in FIGS. 14A-14C. The semiconductor film SLX is removed near the boundaries. As shown in FIGS. 15A-15C, a gate insulating film GI made of SiO 80 nm thick is deposited, and further a metal film WG made of W 30 nm thick and a metal film MWG made of MoW 150 nm thick are deposited by sputtering, and processed into gate electrodes by photolithography.

The upper MoW film MWG of the gate electrodes is wet-etched with an etchant containing phosphoric acid, nitric acid and acetic acid, so as to be processed into a shape side-etched by 0.5 μm from a resist pattern RST used for processing the gates. After that, dry etching is further performed with fluorochemical gas so as to process the lower W film of the gate electrodes with the resist as a mask. Thus, a structure where only the W film 0.5 μm thick survives near the gate terminals is formed.

Figure 16A:
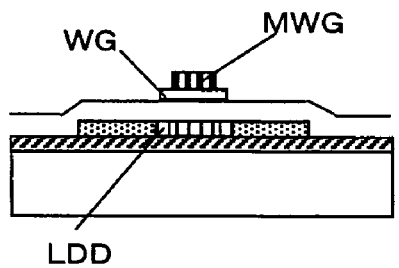
FIGS. 16A-16C are schematic sectional views following FIGS. 15A-15C, for further explaining the TFT process in FIG. 12.
Figure 16B:
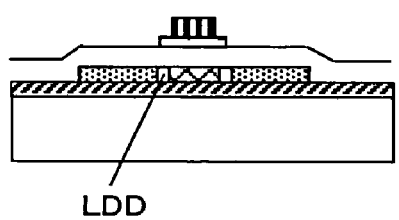
Figure 16C:

P ions are injected with the resist as a mask so as to form regions serving as sources/drains SD. After the resist RST is removed, P ions are injected with low density. Thus, so-called GOLD-structure TFTs in which a low-density drain region LDD is formed under the W film WG near each gate terminal by self-alignment are formed (FIGS. 16A-16C). Though not shown, in accordance with necessity, boron is injected with high density with a resist as a mask so as to invert the source/drain regions into a P type and thereby form P-type transistors. The mask has openings only in portions corresponding to the P-type TFTs.

Figure 17A:
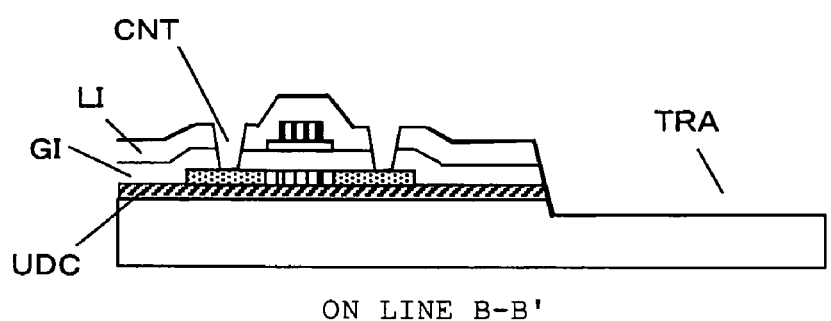
FIGS. 17A-17C are schematic sectional views following FIGS. 16A-16C, for further explaining the TFT process in FIG. 12.
Figure 17B:
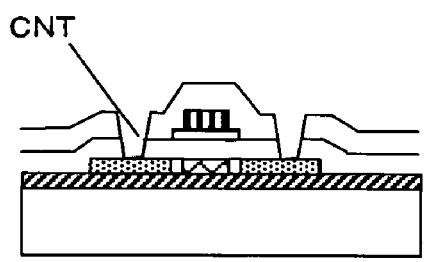
Figure 17C:
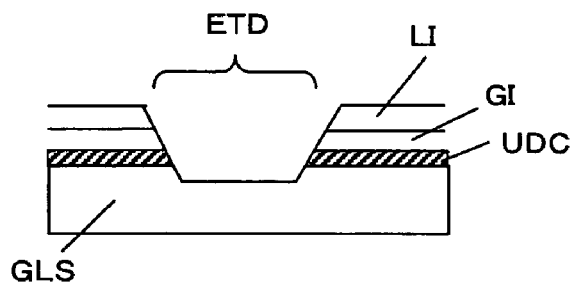

An interlayer insulating film made of SiN and SiO is deposited by plasma CVD. After that, annealing at 420° C. is performed to perform a termination process and activate doped impurities. The interlayer insulating film and the gate insulating film are etched with a resist as a mask so as to open contacts CNT with sources/drains and gate electrodes, and transmission regions TRA of pixels (FIGS. 17A-17C). In this event, the interlayer insulating film LI, the gate insulating film GI and the undercoat insulating film UDC in the boundary portions among semiconductor devices are etched, and the surface of the glass substrate GLS lying thereunder is also etched by about 0.5 μm. A metal film made of a lamination of Ti and Al is deposited by sputtering, and Al wiring is formed by use of photolithography. Further, an organic protective film is applied, exposed to light, and developed to open through holes in pixel portions.

Figure 18A:
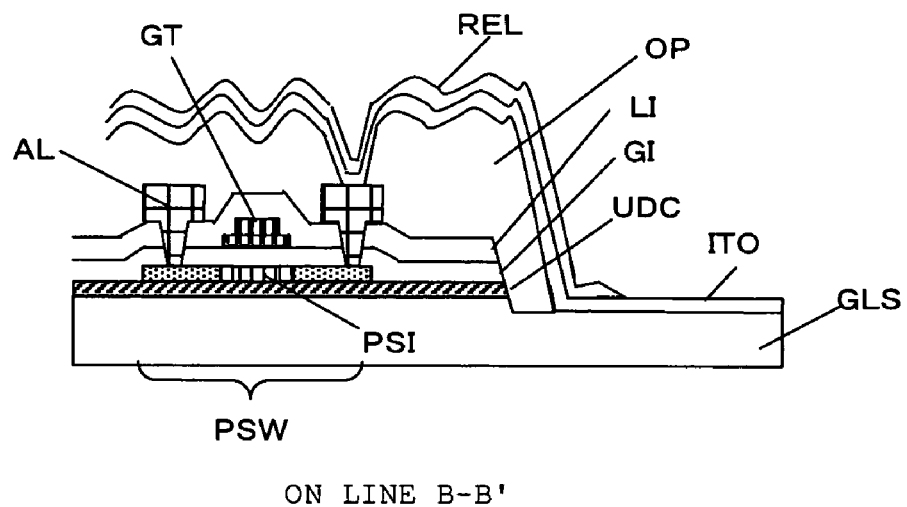
FIGS. 18A-18C are schematic sectional views following FIGS. 17A-17C, for further explaining the TFT process in FIG. 12.
Figure 18B:
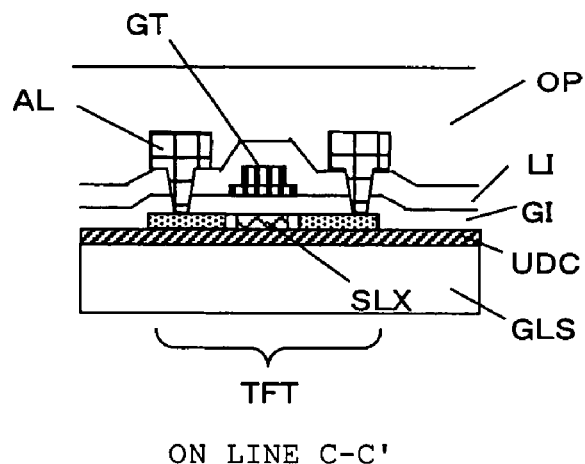
Figure 18C:
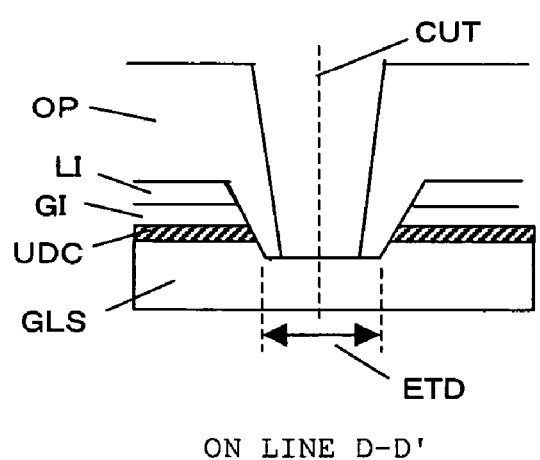
Figure 19:
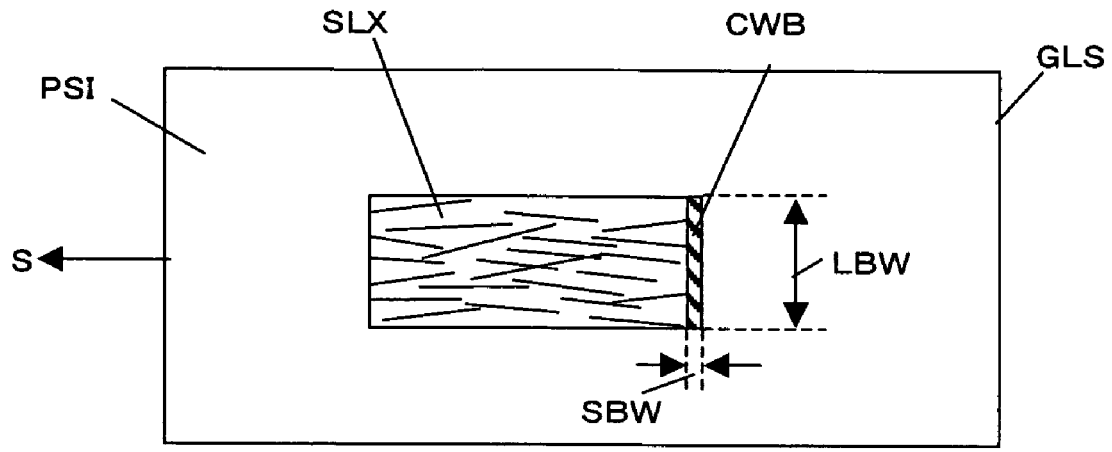
FIG. 19 is a view for explaining a crystallizing method using a CW laser.
Figure 20:
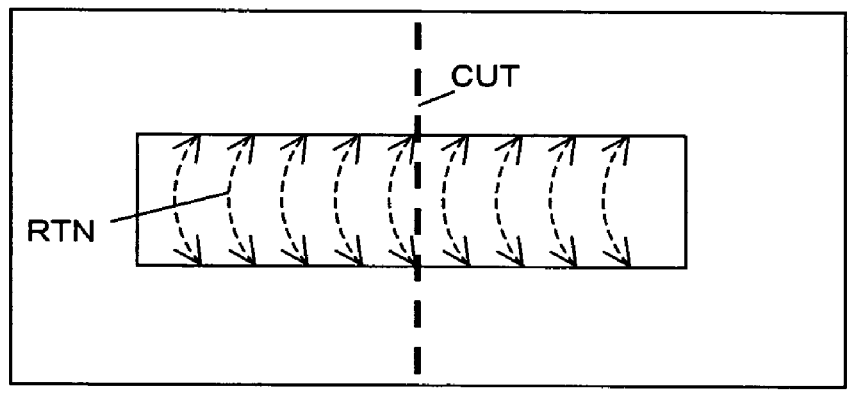
FIG. 20 is a view showing stress generated due to irradiation with a CW laser beam, and a cutting position of a substrate.

In this event, the organic protective film OP near the boundaries among the semiconductor devices is also opened. In addition, irregularities for giving a variation to the reflection direction are formed in the organic protective film OP in regions serving as reflecting portions. Further, a transparent conductive film made of indium tin oxide is deposited by sputtering, and patterned into pixel electrodes ITO by photolithography. A reflecting film made of a lamination of an MoW alloy and an Ag alloy is deposited thereon by sputtering, and formed into reflecting electrodes REL by use of photolithography. Thus, a configuration shown in FIGS. 18A-18C is formed. In the aforementioned processes, it is possible to manufacture a TFT substrate having a configuration in which the glass substrate surface is etched near the boundaries around the respective semiconductor devices as shown in FIG. 11. In FIG. 18A, a pixel switch PSW made of a TFT using polycrystalline silicon PSI made of isotropic crystal grains is formed in each pixel portion by use of a pulsed excimer laser. In FIG. 18B, a TFT using polycrystalline silicon SLX made of crystal grains grown laterally to be long substantially in the same direction as the direction of a current flowing in a TFT channel is formed in each circuit portion by use of a CW laser.

Next, in the process shown by the process group B in FIG. 12, an opposed substrate is bonded to the substrate, liquid crystals are injected therebetween, and the substrate lamination is cut. After that, semiconductor devices serving as semi-transmissive liquid crystal display devices are obtained through a module process.

In this embodiment, the undercoat film and the vicinities of the surface of the glass substrate causing tensile stress are removed by etching near the substrate cutting position. Thus, it is possible to suppress propagation of cracks when the substrate is cut. The cracks stop at a distance of about 10 μm in a low-stress region. In consideration of the reduction caused by grinding of each end surface after cutting, the etching range over the undercoat film and the substrate is set at a distance as long as the thickness of the substrate or at a distance of about 0.5 mm in this embodiment from the cut surface. Thus, it is possible to suppress propagation of cracks. In this embodiment, it will go well even if the increment of tensile stress in the circuit is not lower than 200 N/m. There is an advantage that even in wider laser conditions, irradiation with the CW laser beam can be performed upon the substrate including the boundaries among the semiconductor devices in the same manner as in the embodiment described in FIG. 9.

In the embodiment of the present invention, the etching region ETD is provided to include the substrate cutting position CUT. However, the etching region ETD does not have to include the cutting position, but may be provided between the cutting position CUT and the circuit region DCR. Any crack generated by substrate cutting stops in the etching region. Accordingly, propagation of the crack to the circuit region can be suppressed so that a failure of disconnection can be prevented.

Figure 22:
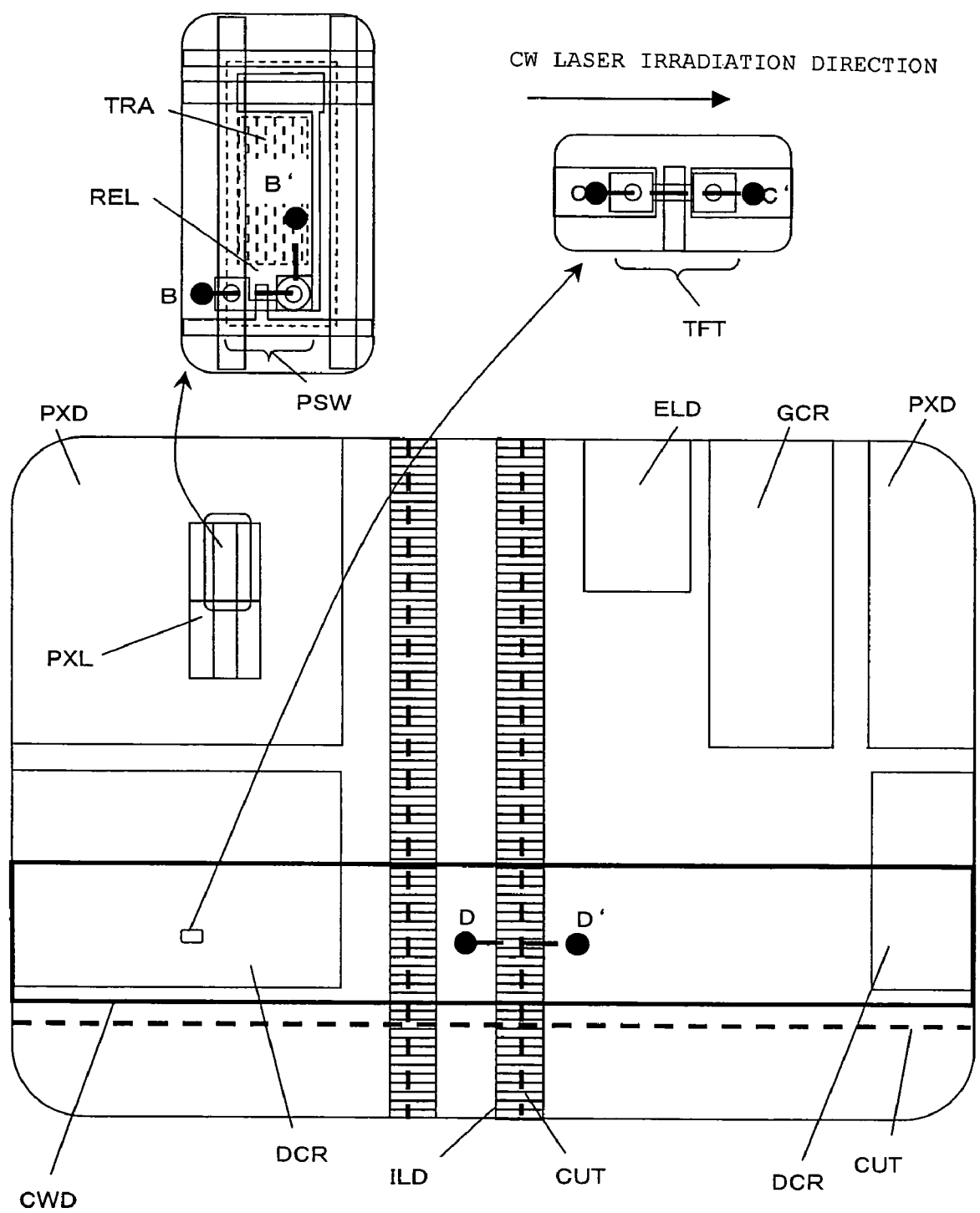
FIG. 22 is a view explaining an example of a peripheral portion of a TFT substrate serving as semiconductor devices manufactured according to a fourth embodiment of the present invention.

FIG. 22 is an enlarged view showing the vicinities of a substrate cutting position of semiconductor devices formed according to a fourth embodiment of the present invention. In FIG. 22, the portion corresponding to the portion A of FIG. 10 according to the third embodiment is enlarged. A region CWD in which a semiconductor film grown laterally by continuous irradiation with a CW laser beam is formed on a substrate is formed across a substrate cutting position CUT. A periphery of the substrate cutting position is included in a region ILD where a protective film made of an organic film is opened and another insulating film is deposited.

Figure 23:
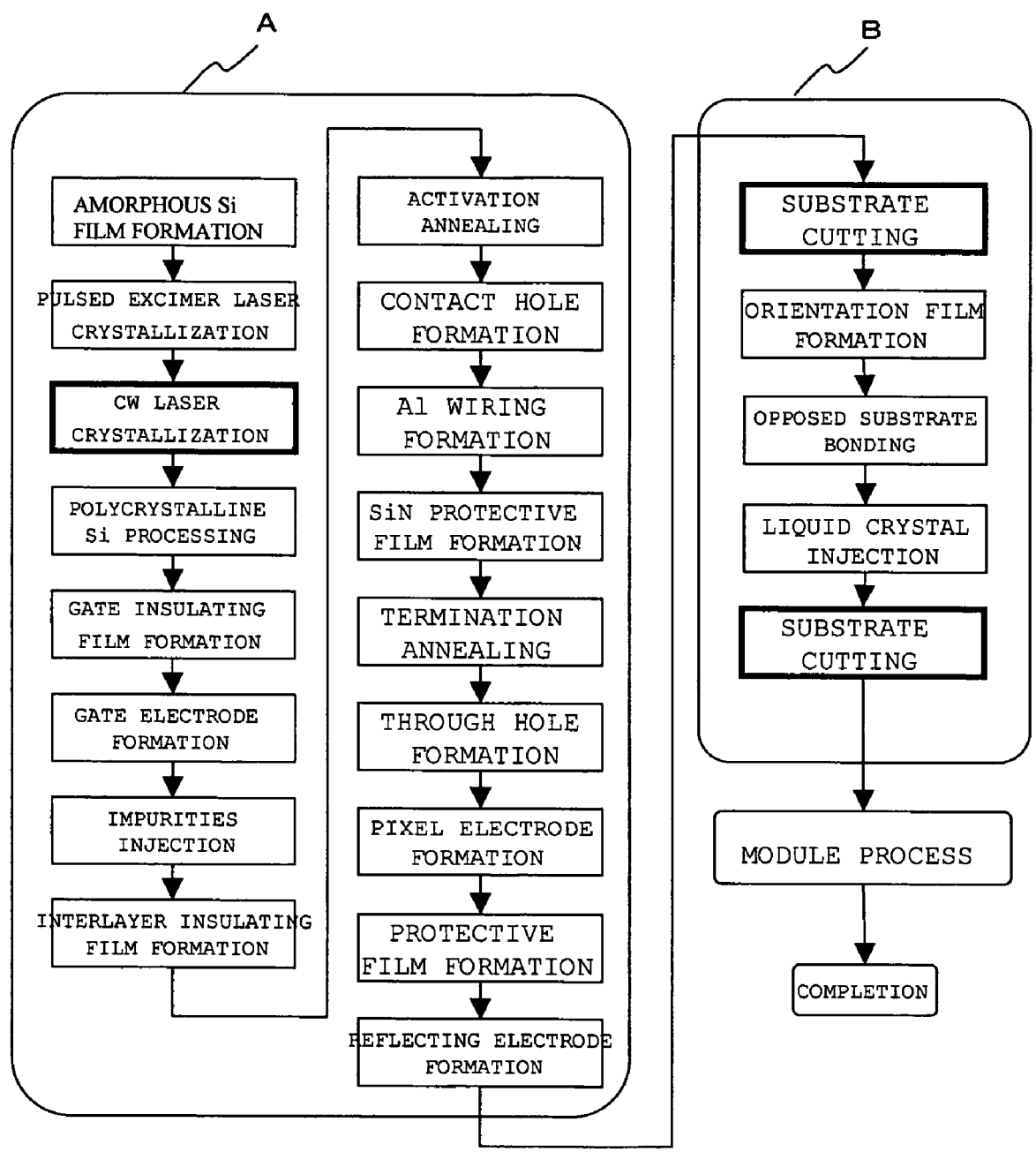
FIG. 23 is a flow chart for explaining a manufacturing process of semiconductor devices according to the fourth embodiment of the present invention.
Figure 24A:
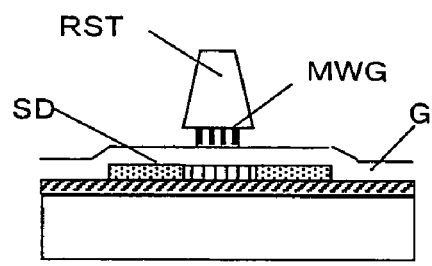
FIGS. 24A-24C are schematic sectional views for further explaining a TFT process in FIG. 23.
Figure 24B:
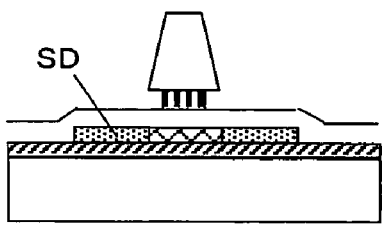
Figure 24C:
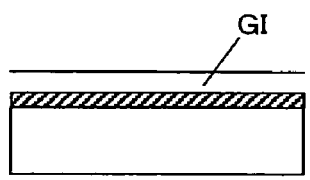
Figure 25A:
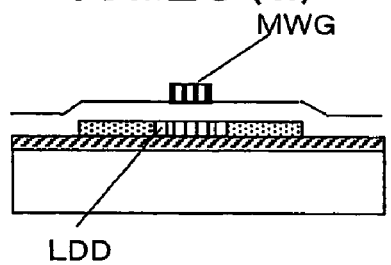
FIGS. 25A-25C are schematic sectional views following FIGS. 24A-24C, for further explaining the TFT process in FIG. 23.
Figure 25B:
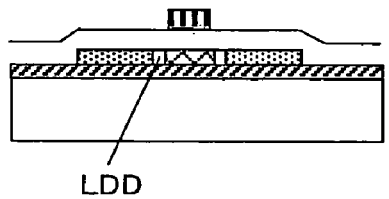
Figure 25C:
Figure 26A:
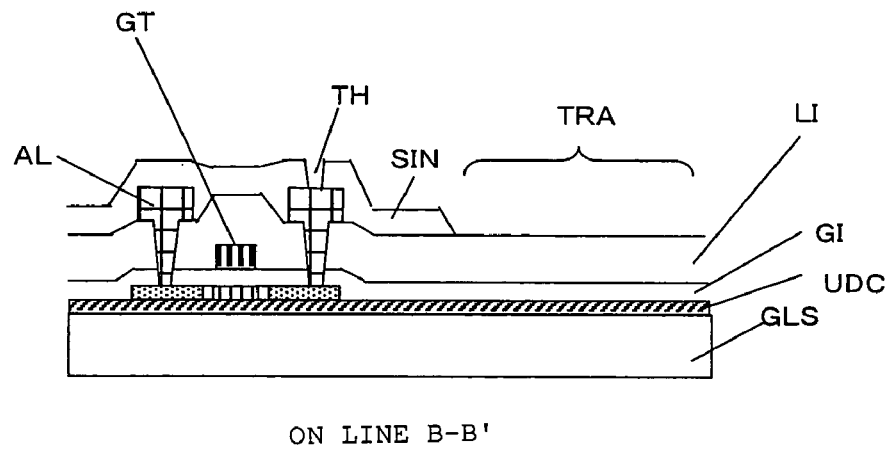
FIGS. 26A-26C are schematic sectional views following FIGS. 25A-25C, for further explaining the TFT process in FIG. 23.
Figure 26B:
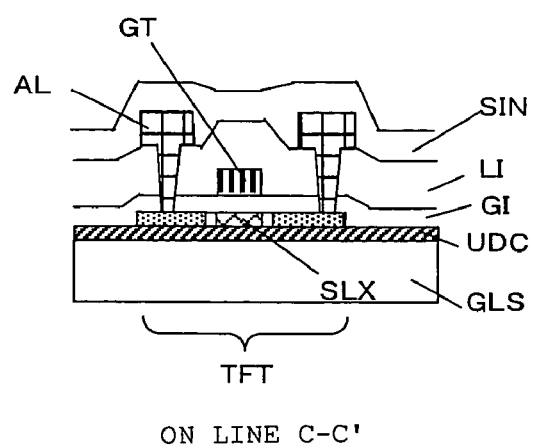
Figure 26C:
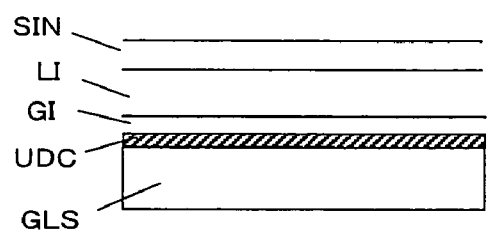
Figure 27A:
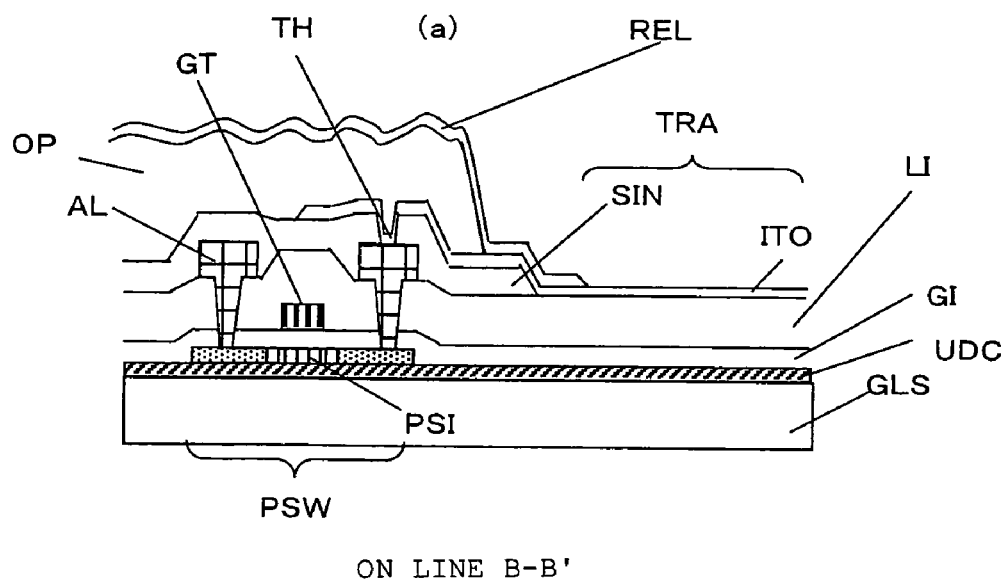
FIGS. 27A-27C are schematic sectional views following FIGS. 26A-26C, for further explaining the TFT process in FIG. 23.
Figure 27B:
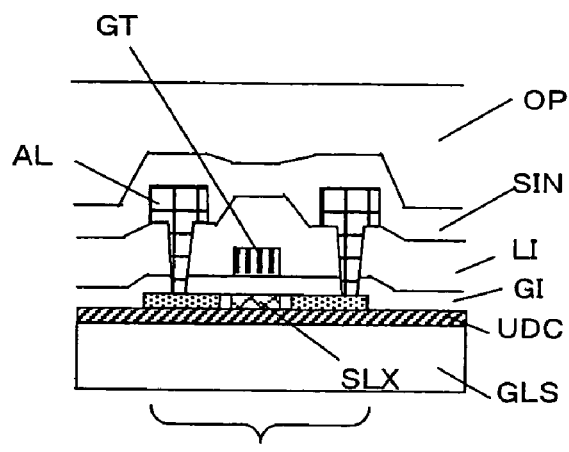
Figure 27C:
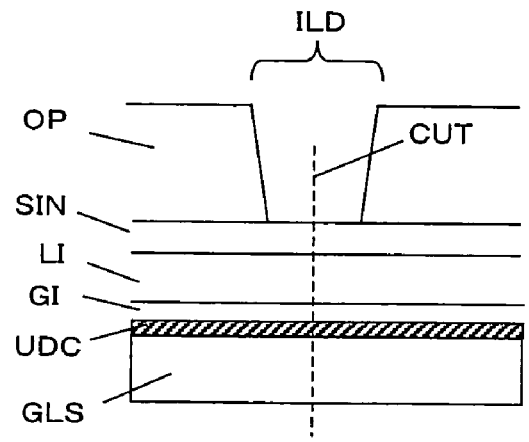

FIG. 23 is a flow chart for explaining a manufacturing process of semiconductor devices according to the fourth embodiment. FIG. 23 shows an example in which semi-transmissive liquid crystal display devices are formed in the same manner as in the third embodiment. In a process group A which is a process for manufacturing a TFT substrate, irradiation conditions of a CW laser beam are, for example, set so that the scanning speed is 200 mm/sec, and the laser power is 4 in Table 1. In an interlayer insulating film formation process, an interlayer insulating film made of Si is deposited to be 0.6 μm thick. In an Si protective film forming process, an SiN protective film made of SiN is deposited to be 0.2 μm thick. A TFT substrate is formed through a process for forming through holes in the SiN protective film (through hole process), a process for forming transparent electrodes (transparent electrode process), a process for forming an organic protective film (protective film process), and a process for forming reflecting electrodes (reflecting electrode process). The other processes are similar to those in FIG. 2, so that redundant description thereof will be omitted. Further, semiconductor devices are formed by a process group B including a substrate cutting process in the same manner as in FIG. 2.

FIGS. 24A-24C to 27A-27C are views showing the formation processes of sections in FIG. 22 respectively. FIGS. 24A-27A, 24B-27B and 24C-27C correspond to the sections taken on line B-B', line C-C' and line D-D' in FIG. 22 respectively. A pattern made of a polycrystalline Si film PSI and a laterally grown polycrystalline Si film SLX is formed on a glass substrate through an undercoat film UDC in the same processes as those in FIGS. 13A-13C and 14A-14C. After that, a gate insulating film GI made of SiO is deposited to be 110 nm thick by plasma CVD using TEOS. Further, a metal film made of an MoW alloy is deposited to be 200 nm thick by sputtering. With a resist RST as a mask, the metal film MWG is wet-etched to form gates. In this event, the amount of side etching is controlled to process each gate into a shape set back by 1 μm from the resist pattern. With the resist RST as a mask, phosphorous is implanted with high density to form a shape in FIGS. 24A-24C. After the resist is removed, phosphorous is implanted with low density so as to form each device into a shape in FIGS. 25A-25C, in which an N-type TFT having a low-density region LDD near a gate terminal is formed. Though not shown, boron is implanted into predetermined positions if necessary. Thus, P-type TFTs may be formed.

Further, an interlayer insulating film LI made of SiO is formed to be 0.6 μm thick by plasma CVD, and then annealed at 600° C. so as to activate impurities. The interlayer insulating film is etched to form contact holes, and Al wiring is then formed. In this event, the interlayer insulating film on line D-D' corresponding to the substrate cutting position is not etched. Further, an SiN protective film made of SiN is deposited to be 0.2 μm thick by plasma CVD, and a passivation process is performed at 400° C. Further, through holes TH are opened in the SiN protective film by dry etching. In this event, the SiN protective film in the transmission region TRA of each pixel portion is opened. On the other hand, the SiN protective film on line D-D' corresponding to the substrate cutting position is not etched. Further, after transparent electrodes ITO are formed, a protective film OP made of an organic film is formed. The protective film OP is opened in the transmission region TRA of each pixel portion, and opened in a region on line D-D' including the substrate cutting position. Finally, reflecting electrodes REL made of a laminated film of MoW and an Al alloy are formed to form a shape in FIGS. 27A-27C. Thus, a TFT substrate is formed. Then, semiconductor devices are formed in a process including substrate cutting.

In this embodiment, expansion of cracks caused by anisotropic tensile stress near the glass substrate surface is suppressed by the insulating film deposited near the substrate cutting position so that propagation of the cracks when the substrate is cut can be suppressed. In this embodiment, it will go well even if the increment of tensile stress in the circuit is not lower than 200 N/m. There is an advantage that even in wider laser conditions, irradiation with the CW laser beam can be performed upon the substrate including the boundaries among the semiconductor devices in the same manner as in the embodiment described in FIG. 9. When the insulating film is formed not only in the periphery of the substrate but also in a continuous region including a region irradiated with the CW laser beam, occurrence of cracks after the devices are formed can be suppressed.

Instead of the region continuously irradiated with the CW laser beam in the third or fourth embodiment, an unirradiated region may be provided in each boundary between semiconductor devices in the same manner as in the embodiment of FIG. 4. Due to the unirradiated region, any crack caused by a defect such as damage in the substrate surface can be restrained from propagating to another region during the manufacturing process before the process for etching the substrate surface or depositing the insulating film. Thus, the yield is improved. When the CW laser beam irradiation conditions are set so that the increment of tensile stress will be not higher than 200 N/m so that cracks can be prevented from propagating, the yield is more improved.

In each embodiment of the present invention, display panels provided with pixels for displaying images were described as semiconductor devices by way of example. However, the present invention is not always limited to semiconductor devices requiring pixels. The present invention is also applicable to formation of semiconductor devices having only circuits formed therein. In this case, the process group B is not required, but the process for cutting the substrate is required. When only circuits are formed in a substrate, all the circuit regions may be formed out of a semiconductor film obtained by irradiating an amorphous Si film directly with a CW laser beam to thereby crystallize the amorphous Si film. Thus, irradiation with a pulsed excimer laser beam can be made unnecessary.

What is claimed is:

1. A semiconductor device comprising:
   a glass substrate having a strain point not higher than 750° C.;
   a semiconductor film having Si as a chief component and being formed on at least a part of the glass substrate;
   a pixel region formed with pixels for displaying an image, said pixel region including a part of the semiconductor film; and
   a circuit for driving the pixels of the pixel region;
   wherein at least one region of the semiconductor film having crystals grown laterally as irradiated with a CW laser beam is included in at least as a part of the circuit, and a difference between a tensile stress of a surface of glass of the glass substrate in said region that is grown with the crystals laterally and a tensile stress of a surface of glass of the glass substrate in the pixel region is not larger than 200 N/m, and wherein a tensile stress of a surface of glass of the glass substrate in a direction perpendicular to a growth direction of the laterally grown crystals of the semiconductor film is higher than a tensile stress of a surface of glass of the glass substrate in the growth direction, in said region that is grown with the crystals laterally.

2. A semiconductor device according to claim 1, wherein the semiconductor film is formed on an undercoat insulating film formed on the glass substrate, and vicinities of a surface of the glass substrate are removed together with the undercoat insulating film in at least a part of the periphery of the glass substrate.

3. A semiconductor device comprising:

a glass substrate having a strain point not higher than 750° C.;

a semiconductor film having Si as a chief component and formed on at least a part of the glass substrate;

a pixel region formed with pixels for displaying an image, said pixel region including a part of the semiconductor film;

a circuit formed on the glass substrate and for driving the pixels; and an insulating film made of a silicon oxide film or a silicon nitride film, being not thinner than 0.5 μm, and formed in at least a part of a periphery of the glass substrate;

wherein at least one region of the semiconductor film is included in at least a part of the circuit, and a difference between a tensile stress of a surface of glass of the glass substrate in said semiconductor film region that is grown with the crystals laterally and a tensile stress of a surface of glass of the glass substrate in the pixel region is not larger than 200 N/m, and wherein a tensile stress of a surface of glass of the glass substrate in a direction perpendicular to a growth direction of the laterally grown crystals of the semiconductor film is higher than a tensile stress of a surface of glass of the glass substrate in the growth direction, in said semiconductor film region that is grown with the crystals laterally.

* * * * *